US010629614B2

(12) United States Patent
Oh

(10) Patent No.: US 10,629,614 B2
(45) Date of Patent: Apr. 21, 2020

(54) SEMICONDUCTOR MEMORY DEVICE AND METHOD FOR FORMING THE SAME

(71) Applicant: SK hynix Inc., Gyeonggi-do (KR)

(72) Inventor: Sung-Lae Oh, Chungcheongbuk-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/220,892

(22) Filed: Dec. 14, 2018

(65) Prior Publication Data

US 2020/0020714 A1 Jan. 16, 2020

(30) Foreign Application Priority Data

Jul. 12, 2018 (KR) .................. 10-2018-0081048

(51) Int. Cl.
*H01L 45/00* (2006.01)
*H01L 27/11582* (2017.01)
*H01L 27/11548* (2017.01)
*H01L 27/11556* (2017.01)

(52) U.S. Cl.
CPC .. *H01L 27/11582* (2013.01); *H01L 27/11548* (2013.01); *H01L 27/11556* (2013.01); *H01L 45/1253* (2013.01); *H01L 45/145* (2013.01)

(58) Field of Classification Search
CPC ............................... G11C 16/10; G11C 16/26
USPC ...................................... 365/185.01, 185.24
See application file for complete search history.

(56) References Cited

U.S. PATENT DOCUMENTS

| | | | | |
|---|---|---|---|---|
| 6,187,622 B1 * | 2/2001 | Kuroiwa | ................. | H01L 28/60 438/240 |
| 8,921,182 B2 * | 12/2014 | Jung | ................. | H01L 29/66833 438/268 |
| 9,627,400 B2 * | 4/2017 | Koshiishi | ............ | H01L 29/7926 |
| 9,793,353 B1 * | 10/2017 | Tsai | ...................... | H01L 29/152 |
| 9,806,092 B1 * | 10/2017 | Minemura | ........ | H01L 27/11565 |
| 10,074,667 B1 * | 9/2018 | Higashi | ............. | H01L 27/11521 |
| 10,229,929 B2 * | 3/2019 | Kim | .................. | H01L 27/11582 |
| 10,311,928 B2 * | 6/2019 | Seo | ..................... | G11C 11/1673 |
| 10,332,788 B2 * | 6/2019 | Noh | ................... | H01L 21/76816 |
| 10,388,605 B2 * | 8/2019 | Kim | .................... | H01L 23/5226 |
| 10,396,035 B2 * | 8/2019 | Park | .................. | H01L 21/76805 |

(Continued)

FOREIGN PATENT DOCUMENTS

| | | |
|---|---|---|
| KR | 1020170014757 | 2/2017 |
| KR | 1020170083948 | 7/2017 |

*Primary Examiner* — Michael T Tran
(74) *Attorney, Agent, or Firm* — IP & T Group LLP

(57) ABSTRACT

A semiconductor memory device includes a substrate defined with a first cell region, a slimming region extending from the first cell region in a first direction and a second cell region extending from the slimming region in the first direction; first and second electrode structures each including electrodes which are stacked on the substrate, and disposed to be separated from each other in a second direction crossing with the first direction, with a slit interposed therebetween; and a plurality of step-shaped holes disposed in the slimming region along the first direction, and respectively formed in the first and second electrode structures. Each of the step-shaped holes includes first step structures which face each other in the first direction, are symmetrical to each other and are separated by the slit and second step structures which face each other in the second direction and are symmetrical to each other.

20 Claims, 34 Drawing Sheets

(56) References Cited

U.S. PATENT DOCUMENTS

| | | | |
|---|---|---|---|
| 10,403,634 B2* | 9/2019 | Hwang | H01L 27/1157 |
| 10,411,071 B2* | 9/2019 | Inaba | H01L 27/249 |
| 10,424,595 B2* | 9/2019 | Cha | H01L 27/11575 |
| 10,446,575 B2* | 10/2019 | Kim | H01L 27/1157 |
| 10,446,580 B2* | 10/2019 | Yun | H01L 23/5226 |
| 2011/0228582 A1* | 9/2011 | Park | G11C 5/025 |
| | | | 365/51 |
| 2012/0043673 A1* | 2/2012 | Chang | H01L 27/11551 |
| | | | 257/786 |
| 2013/0009229 A1* | 1/2013 | Lee | H01L 29/66833 |
| | | | 257/314 |
| 2014/0054538 A1* | 2/2014 | Park | H01L 27/249 |
| | | | 257/5 |
| 2014/0162420 A1* | 6/2014 | Oh | H01L 27/11565 |
| | | | 438/270 |
| 2015/0206895 A1* | 7/2015 | Oh | H01L 23/528 |
| | | | 257/324 |
| 2016/0268290 A1* | 9/2016 | Matsunaga | H01L 27/11582 |
| 2016/0322376 A1* | 11/2016 | Lee | H01L 27/11529 |
| 2017/0069731 A1* | 3/2017 | Kim | H01L 27/11556 |
| 2017/0077107 A1* | 3/2017 | Iguchi | H01L 27/11573 |
| 2017/0263630 A1* | 9/2017 | Noda | H01L 27/11565 |
| 2017/0271347 A1* | 9/2017 | Fukuzumi | H01L 27/11565 |
| 2017/0323898 A1* | 11/2017 | Oh | H01L 27/11582 |

\* cited by examiner

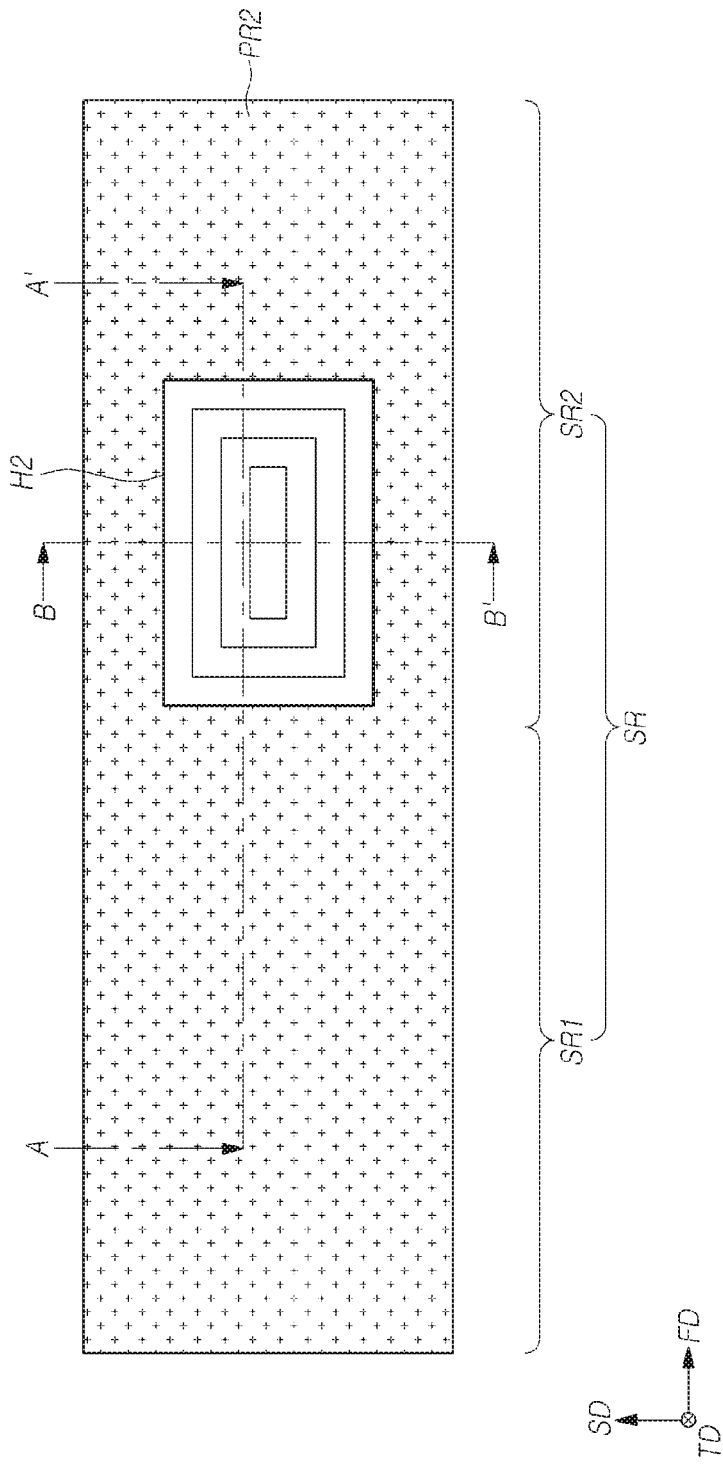

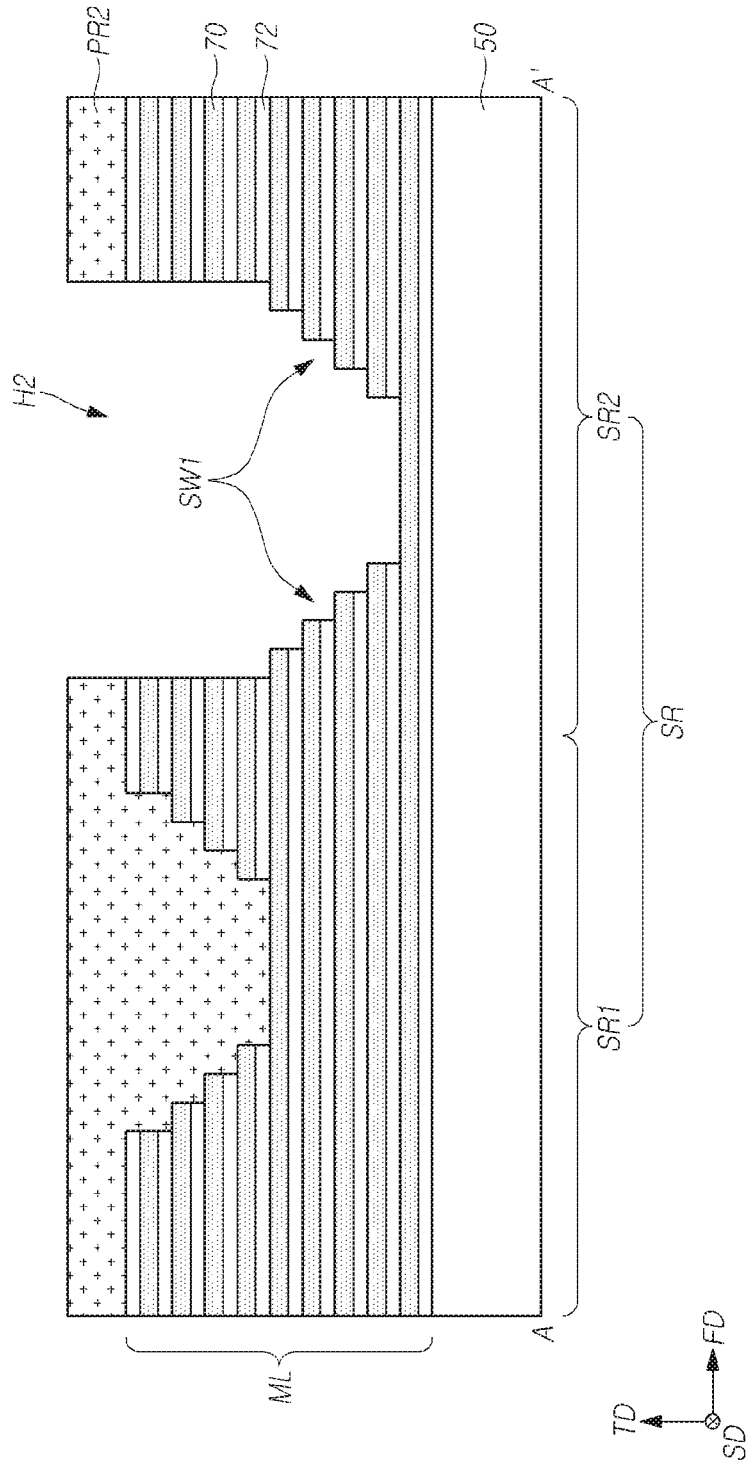

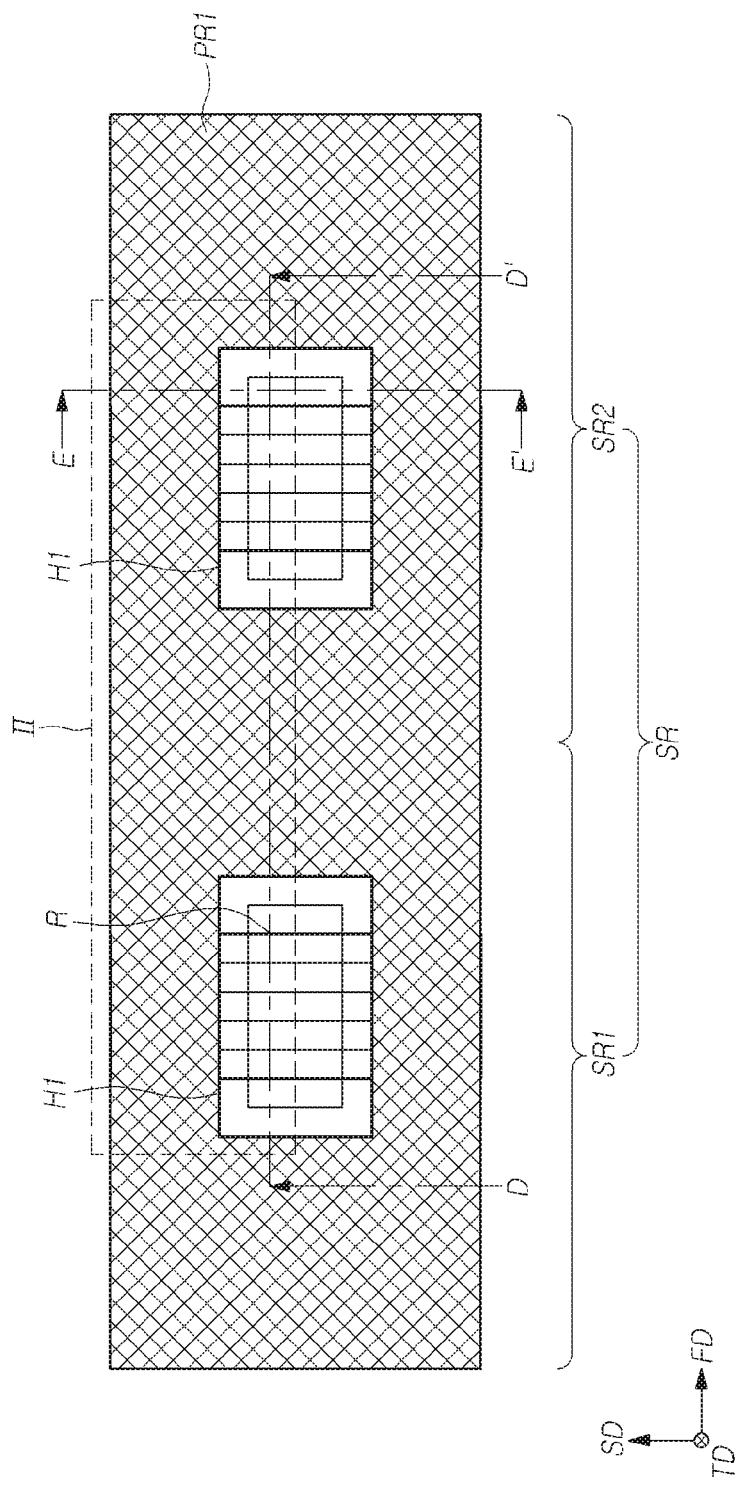

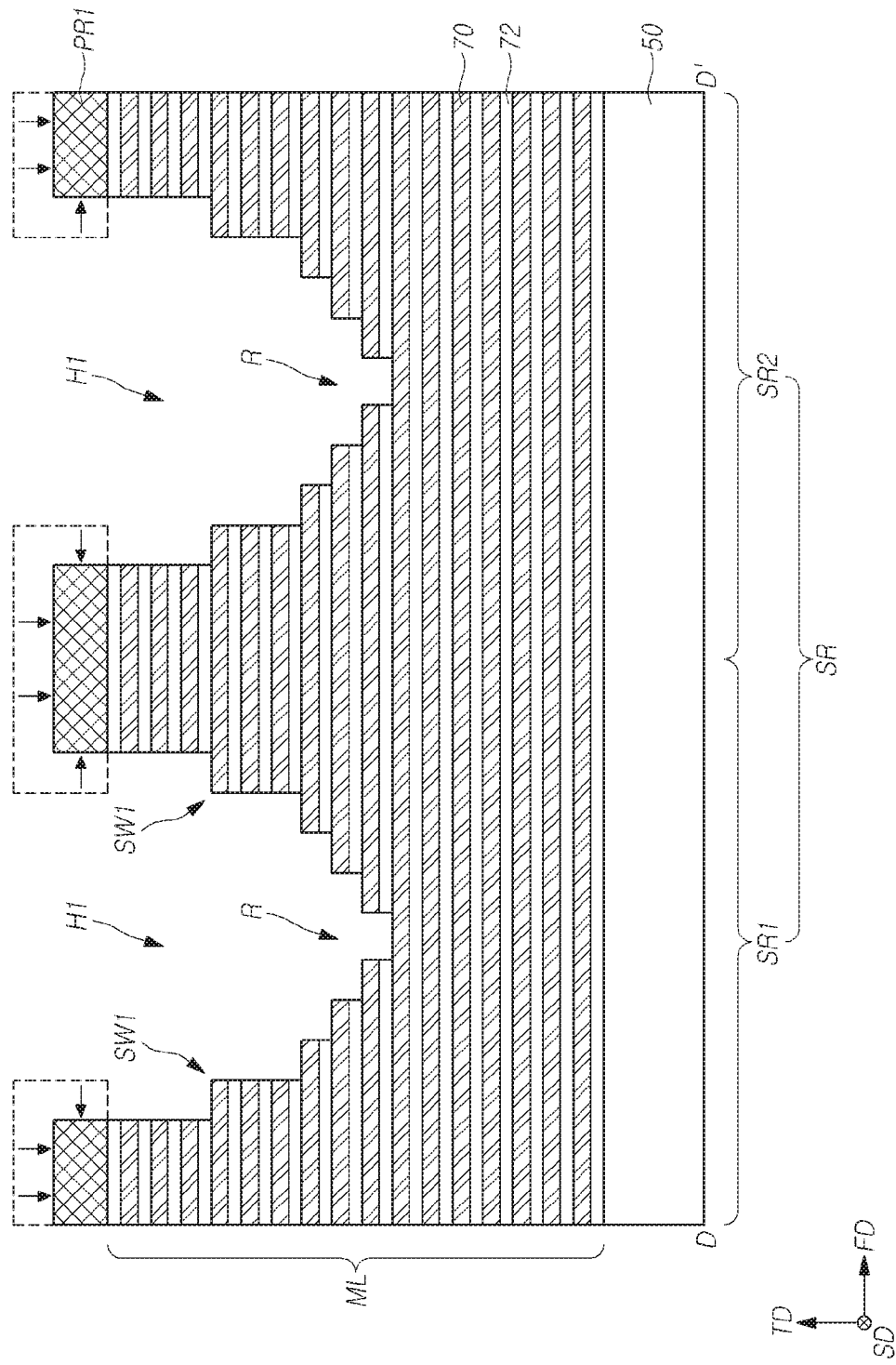

SEMICONDUCTOR MEMORY DEVICE AND METHOD FOR FORMING THE SAME

CROSS-REFERENCE TO RELATED APPLICATION

The present application claims priority under 35 U.S.C. 119(a) to Korean Patent Application No. 10-2018-0081048 filed in the Korean Intellectual Property Office on Jul. 12, 2018, which is incorporated herein by reference in its entirety.

BACKGROUND

1. Technical Field

Various embodiments generally relate to a semiconductor memory device and, more particularly, to a semiconductor memory device of a 3-dimensional structure and a method for forming the same.

2. Related Art

Consumer demand for improved performance and lower price of electronic devices, requires increasing the degree of integration of semiconductor devices which are employed in the electronic devices. In 2-dimensional semiconductor memory devices, the degree of integration is primarily determined by the area occupied by each unit memory cell which depends greatly on the capabilities of fine pattern forming equipment and techniques. However, the very high cost of the equipment and techniques for forming increasingly finer patterns has become prohibitive. Hence, as a practical matter, the degree of integration of 2-dimensional semiconductor memory devices has reached a limit, although some small improvements may still be possible. As an improved alternative to two-dimensional semiconductor devices, semiconductor devices having a 3-dimensional structure with 3-dimensionally arranged memory cells have been proposed.

Three-dimensional semiconductor devices are relatively new and present new challenges for the semiconductor industry. Extensive research is presently underway to provide improved performance, improved methods of making and improved operating methods for three-dimensional semiconductor memory devices.

SUMMARY

In an embodiment, a semiconductor memory device may include: a substrate defined with a first cell region, a slimming region extending from the first cell region in a first direction and a second cell region extending from the slimming region in the first direction; first and second electrode structures each including a plurality of electrodes which are stacked on the substrate, and disposed to be separated from each other in a second direction crossing with the first direction, with a slit interposed therebetween; and a plurality of step-shaped holes disposed in the slimming region along the first direction, and respectively formed in the first and second electrode structures. Each of the step-shaped holes includes first step structures which face each other in the first direction, are symmetrical to each other and are separated by the slit and second step structures which face each other in the second direction and are symmetrical to each other.

In an embodiment, a method for forming a semiconductor memory device may include: forming a stack by alternately stacking first and second material layers on a substrate including a first cell region, a slimming region extending from the first cell region in a first direction and a second cell region extending from the slimming region in the first direction; forming a hole type mask pattern having first opening holes which are disposed in a line along the first direction, on the stack; forming first step-shaped holes each including a pair of first step structures which face each other in the first direction and are symmetrical to each other and a pair of second step structures which face each other in a second direction crossing with the first direction and are symmetrical to each other, by etching the stack through a pad etching process using the hole type mask pattern as an etch barrier; forming a second step-shaped hole by etching the stack such that at least one of the first step-shaped holes is recessed; and dividing the stack by forming a slit which traverses the first and second step-shaped holes in the first direction, in the stack.

A semiconductor memory device, comprising: a substrate; a stack of alternating first and second material layers on the substrate including a first cell region, a slimming region extending from the first cell region in a first direction and a second cell region extending from the slimming region in the first direction; first and second step-shaped holes penetrating the stack at least partially in a third direction, each of the first and second step-shaped holes including a pair of first step structures which face each other in the first direction and are symmetrical to each other and a pair of second step structures which face each other in a second direction crossing with the first direction and are symmetrical to each other; a slit which divides the stack and traverses the first and second step-shaped holes in the first direction, and first and second step-shaped trenches each traversing the entire stack in the second direction and intersecting with the first and second step-shaped holes, respectively.

These and other features and advantages of the present invention will become clear to those skilled in the art of the present invention from the following detailed description in conjunction with the accompanying drawings.

BRIEF DESCRIPTION OF THE DRAWINGS

FIGS. 10A to 11C simplified schematic illustrations of various views of a method for forming a semiconductor memory device in accordance with an embodiment of the present disclosure.

DETAILED DESCRIPTION

Figure 1:
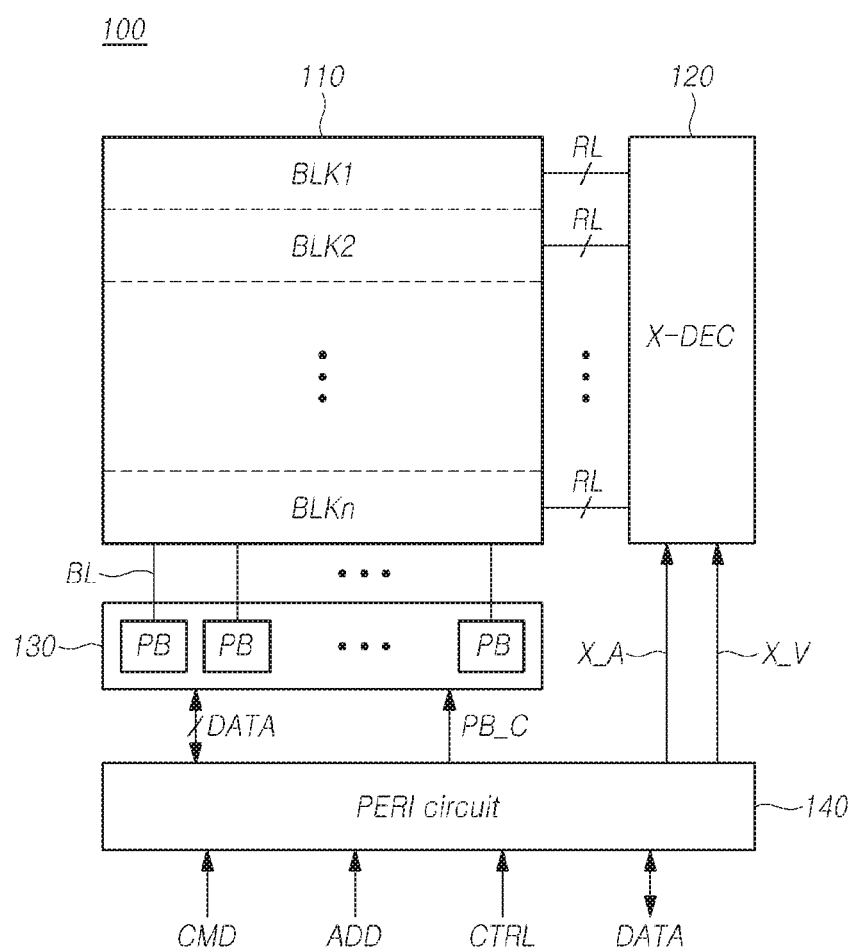
FIG. 1 is a block diagram illustrating an exemplary configuration of a semiconductor memory device in accordance with an embodiment of the present disclosure.

Hereinafter, a semiconductor memory device and a forming method thereof will be described below with reference to the accompanying drawings through various examples of embodiments.

The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present invention as defined in the appended claims.

The present invention is described herein with reference to cross-section and/or plan illustrations of idealized embodiments of the present invention. However, embodiments of the present invention should not be construed as limiting the inventive concept. Although a few embodiments of the present invention will be shown and described, it will be appreciated by those of ordinary skill in the art that changes may be made in these embodiments without departing from the principles and spirit of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention.

As used herein, singular forms are intended to include the plural forms as well, unless the context clearly indicates otherwise.

It will be further understood that the terms "comprises," "comprising," "includes," and "including" when used in this specification, specify the presence of any stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure.

It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

Hereinbelow, in the accompanying drawings, a direction perpendicular to the top surface of a substrate is defined as a third direction TD, and two directions parallel to the top surface of the substrate and intersecting with each other are defined as a first FD and second direction SD, respectively. The substrate may correspond to a single layer or a multi-layer substrate.

FIG. 1 is a block diagram illustrating an exemplary configuration of a semiconductor memory device in accordance with an embodiment of the present disclosure.

Referring to FIG. 1, a semiconductor memory device 100 in accordance with an embodiment may include a memory cell array 110, a row decoder 120, a page buffer circuit 130 and a peripheral circuit 140.

The memory cell array 110 may include a plurality of memory blocks BLK1 to BLKn. Each of the memory blocks BLK1 to BLKn may include a plurality of memory cells. A memory cell may be accessed by a word line and a bit line. A memory cell may be a volatile memory cell which loses data stored therein in the case where power supply is interrupted, or may be a nonvolatile memory cell which retains data stored therein even though power supply is interrupted. While it is described below that the semiconductor memory device 100 is a vertical type NAND flash device, it is to be noted that the technical spirit of the present disclosure is not limited thereto.

The row decoder 120 may be coupled to the memory cell array 110 through row lines RL. The row lines RL may include at least one drain select line, a plurality of word lines and at least one source select line. The row decoder 120 may select one among the memory blocks BLK1 to BLKn of the memory cell array 110 depending on an address information. The row decoder 120 may transfer an operating voltage X_V from the peripheral circuit 140, for example, a program voltage, a pass voltage and a read voltage, to the row lines RL coupled to a selected memory block. In order for transfer of the operating voltage X_V, the row decoder 120 may include a plurality of pass transistors which are respectively coupled to the row lines RL.

The page buffer circuit 130 may be coupled to the memory cell array 110 through bit lines BL. The page buffer circuit 130 may include a plurality of page buffers PB which are respectively coupled to the bit lines BL. The page buffer circuit 130 may receive a page buffer control signal PB_C from the peripheral circuit 140, and may transmit and receive a data signal DATA to and from the peripheral circuit 140.

The page buffer circuit 130 may control a bit line which is coupled with the memory cell array 110, in response to the page buffer control signal PB_C. For example, the page buffer circuit 130 may detect data stored in a memory cell of the memory cell array 110 by sensing the signal of a bit line BL of the memory cell array 110 in response to the page buffer control signal PB_C, and may transmit the data signal DATA to the peripheral circuit 140 depending on the detected data. The page buffer circuit 130 may apply a signal to a bit line BL based on the data signal DATA received from the peripheral circuit 140 in response to the page buffer control signal PB_C, and thereby, may write data in a memory cell of the memory cell array 110. The page buffer circuit 130 may write data in or read data from a memory cell which is coupled to a word line activated by the row decoder 120.

The peripheral circuit 140 may receive a command signal CMD, an address signal ADD and a control signal CTRL from outside the semiconductor memory device 100, and may transmit and receive data DATA to and from a device outside the semiconductor memory device 100, for example, a memory controller. The peripheral circuit 140 may output signals for writing data DATA in the memory cell array 110 or reading data DATA from the memory cell array 110, for example, a row address X_A, the page buffer control signal PB_C and so forth, based on the command signal CMD, the address signal ADD and the control signal CTRL. The peripheral circuit 140 may generate various voltages including the operating voltage X_V, which are required in the semiconductor memory device 100.

Figure 2:
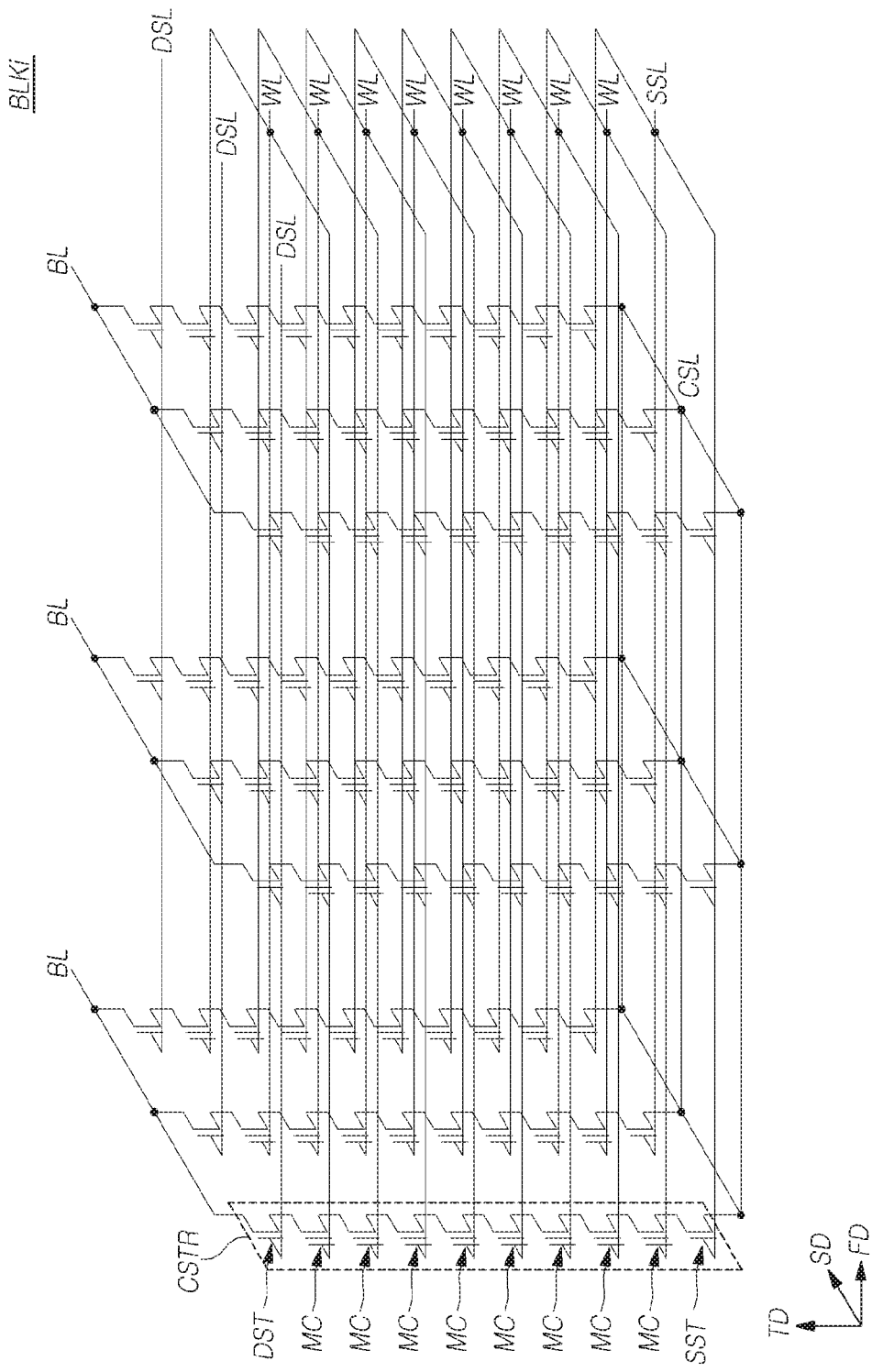
FIG. 2 is an equivalent circuit diagram illustrating an exemplary configuration of one of the memory blocks shown in FIG. 1.

FIG. 2 is an equivalent circuit diagram illustrating an exemplary configuration of one of the memory blocks shown in FIG. 1.

Referring to FIG. 2, a memory block BLKi may include a plurality of cell strings CSTR which are coupled between a plurality of bit lines BL and a common source line CSL.

The bit lines BL may extend in a second direction SD, and may be arranged along a first direction FD. A plurality of cell strings CSTR may be coupled in parallel to each of the bit lines BL. The cell strings CSTR may be coupled in common to the common source line CSL. The plurality of cell strings CSTR may be disposed between the plurality of bit lines BL and one common source line CSL.

Each of the cell strings CSTR may include a drain select transistor DST which is coupled to a bit line BL, a source select transistor SST which is coupled to the common source line CSL, and a plurality of memory cells MC which are coupled between the drain select transistor DST and the source select transistor SST. The drain select transistor DST, the memory cells MC and the source select transistor SST may be coupled in series along a third direction TD.

A source select line SSL, a plurality of word lines WL and drain select lines DSL which extend in the first direction FD may be stacked along the third direction TD between the bit lines BL and the common source line CSL. The drain select lines DSL may be respectively coupled to the gates of corresponding drain select transistors DST. The word lines WL may be respectively coupled to the gates of corresponding memory cells MC. The source select line SSL may be coupled to the gates of source select transistors SST.

Figure 3:
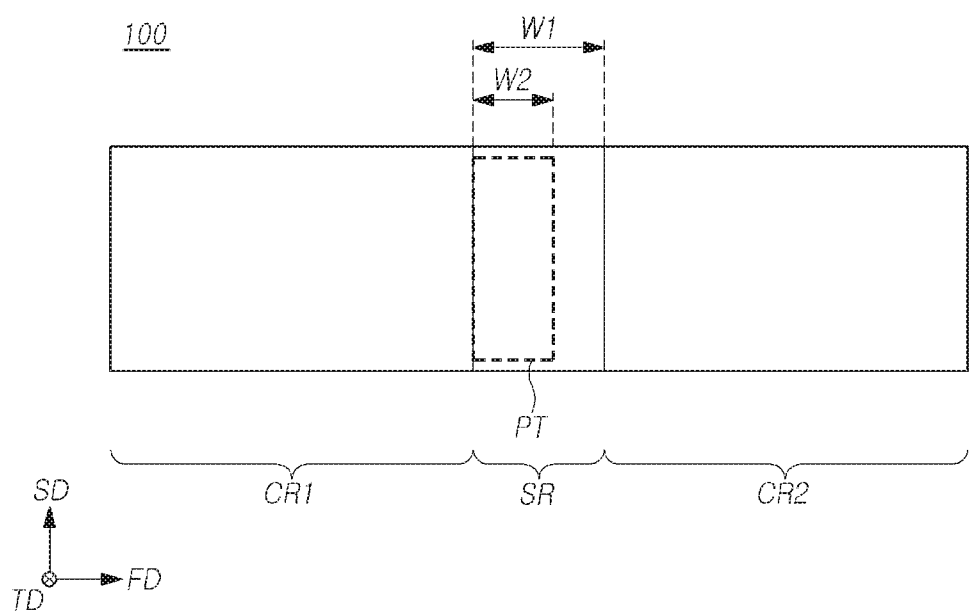
FIG. 3 is a top view illustrating an exemplary configuration of first and second cell regions and a slimming region of a semiconductor memory device in accordance with an embodiment the present disclosure.
Figure 4:
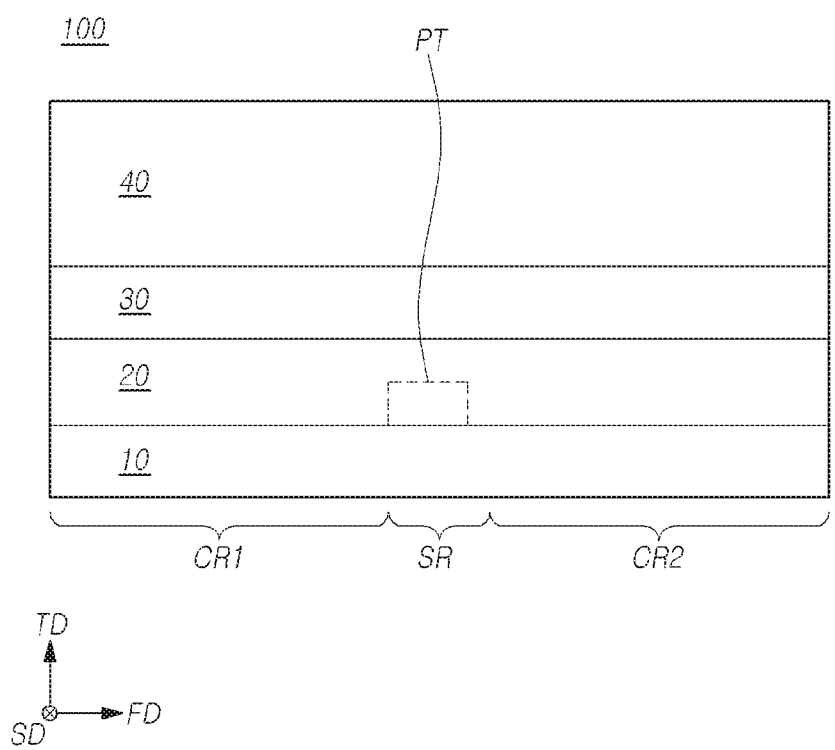
FIG. 4 is a cross-sectional view illustrating an exemplary configuration of a schematic layout of a semiconductor memory device in accordance with an embodiment of the present disclosure.

FIG. 3 is a top view illustrating an exemplary configuration of the regions of a semiconductor memory device in accordance with the present disclosure, and FIG. 4 is a cross-sectional view illustrating an exemplary configuration of the schematic layout of the semiconductor memory device in accordance with the present disclosure.

Referring to FIGS. 3 and 4, a semiconductor memory device 100 may include first and second cell regions CR1 and CR2 and a slimming region SR. The first and second cell regions CR1 and CR2 may be disposed to be separated from each other along the first direction FD, and the slimming region SR may be disposed between the first cell region CR1 and the second cell region CR2.

The semiconductor memory device 100 may include a first substrate 10, a logic structure 20 which is disposed on the first substrate 10, a second substrate 30 which is disposed on the logic structure 20, and a memory structure 40 which is disposed on the second substrate 30. The logic structure 20 may include the row decoder 120, the page buffer circuit 130 and the peripheral circuit 140 of FIG. 1, and the memory structure 40 may include the memory cell array 110 of FIG. 1.

The logic structure 20 of the slimming region SR may include pass transistors PT of the row decoder 120 (see FIG. 1). While not shown, the memory structure 40 may include a plurality of electrodes which are stacked along the third direction TD. The electrodes may include at least one drain select line, a plurality of word lines and at least one source select line. The third direction TD as a direction substantially perpendicular to the top surfaces of the first and second substrates 10 and 30 may also be defined as a vertical direction. In the following descriptions, the terms 'vertical' or 'vertical direction' will be used as having substantially the same meaning as the term 'third direction.'

For coupling with a contact plug, each electrode may include a pad region which is exposed by another electrode positioned on it, in the slimming region SR. In other words in order to provide pad regions, a step structure may be defined in the electrodes of the slimming region SR.

The step structure may be formed by alternately and repeatedly performing an etching process and a trimming process. In the etching process, the electrodes may be etched through using a mask pattern having an opening extending in the second direction SD as the widthwise direction of the electrodes, as an etch barrier. In the trimming process, the width of the opening of the mask pattern may be widened. In the course of forming such a step structure, as the electrodes are divided in the slimming region SR, the electrodes of the first cell region CR1 and the electrodes of the second cell region CR2 may be electrically separated. Since electrodes of the first cell region CR1 and electrodes of the second cell region CR2 which have the same vertical positions should have the same potential, in the case where the electrodes are separated, additional wiring lines should be formed to electrically couple the separated electrodes. Therefore, as the number of entire wiring lines needed in the semiconductor memory device 100 increases, the margin of a wiring line forming process may be decreased.

As a way for preventing the electrodes from being separated, a method of additionally forming a mask pattern which partially covers the opening of the mask pattern, in the etching process, may be used. However, in this case, due to costs incurred in manufacturing the additional mask pattern, the manufacturing cost of the semiconductor memory device 100 may increase.

As a semiconductor memory device trends toward high capacity and high degree of integration, the stack number of word lines is increasing, and accordingly, the number of electrodes including the word lines and the number of pad regions defined in the electrodes are also increasing. If the number of pad regions increases, the width W1 of the slimming region SR in the first direction FD may become longer than the width W2 of the region occupied by the pass transistors PT, and due to this fact, the size of the semiconductor memory device 100 may become larger than a size required for circuit arrangement.

Embodiments of the present disclosure provide a semiconductor memory device capable of preventing separation of electrodes by using a small number of masks or reducing the number of electrodes to be separated, and a method for forming the same. Embodiments of the present disclosure may provide a semiconductor memory device capable of reducing the width of a slimming region and reducing the size of the semiconductor memory device, and a method for forming the same.

Figure 5:
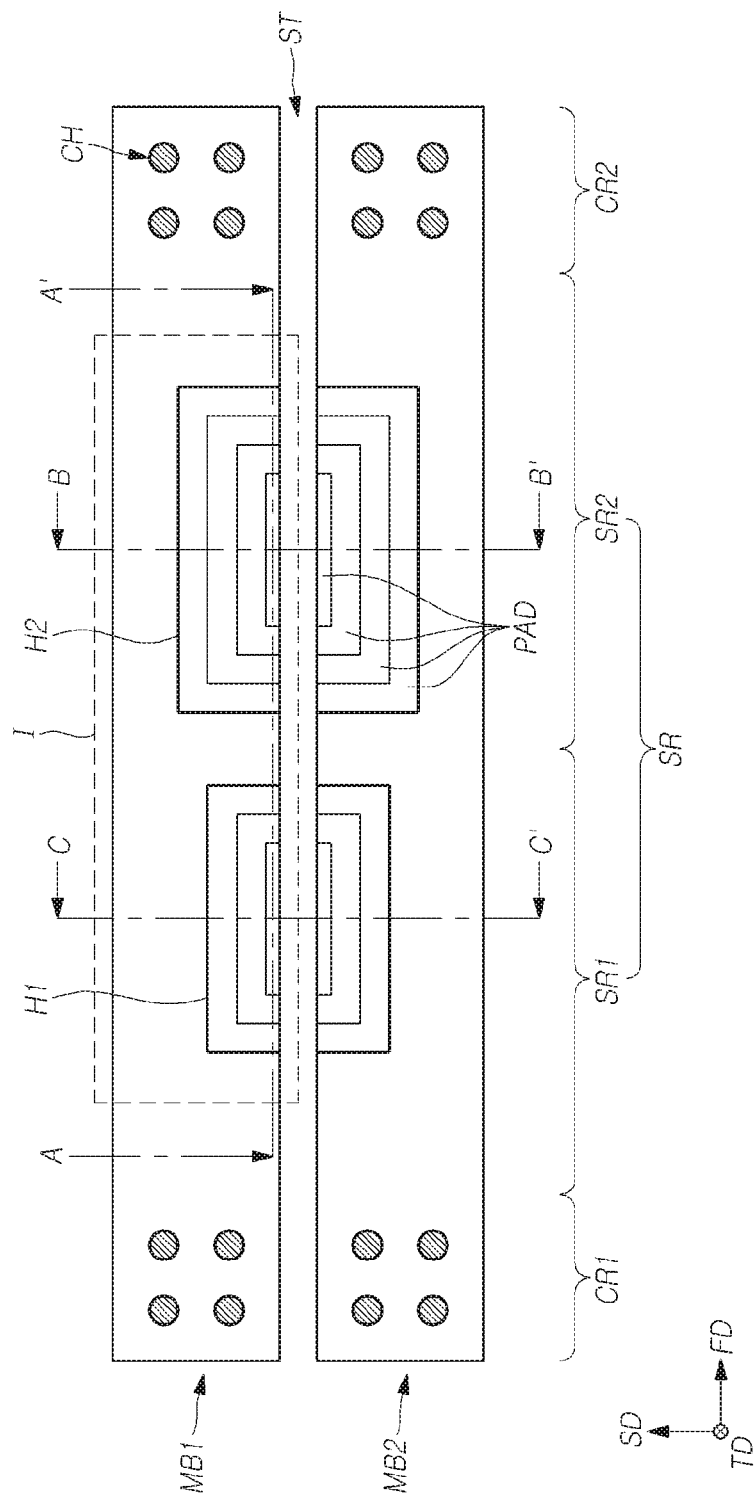
FIGS. 5 to 9 are simplified schematic illustrations of various views of a semiconductor memory device in accordance with an embodiment of the present disclosure.
Figure 6:
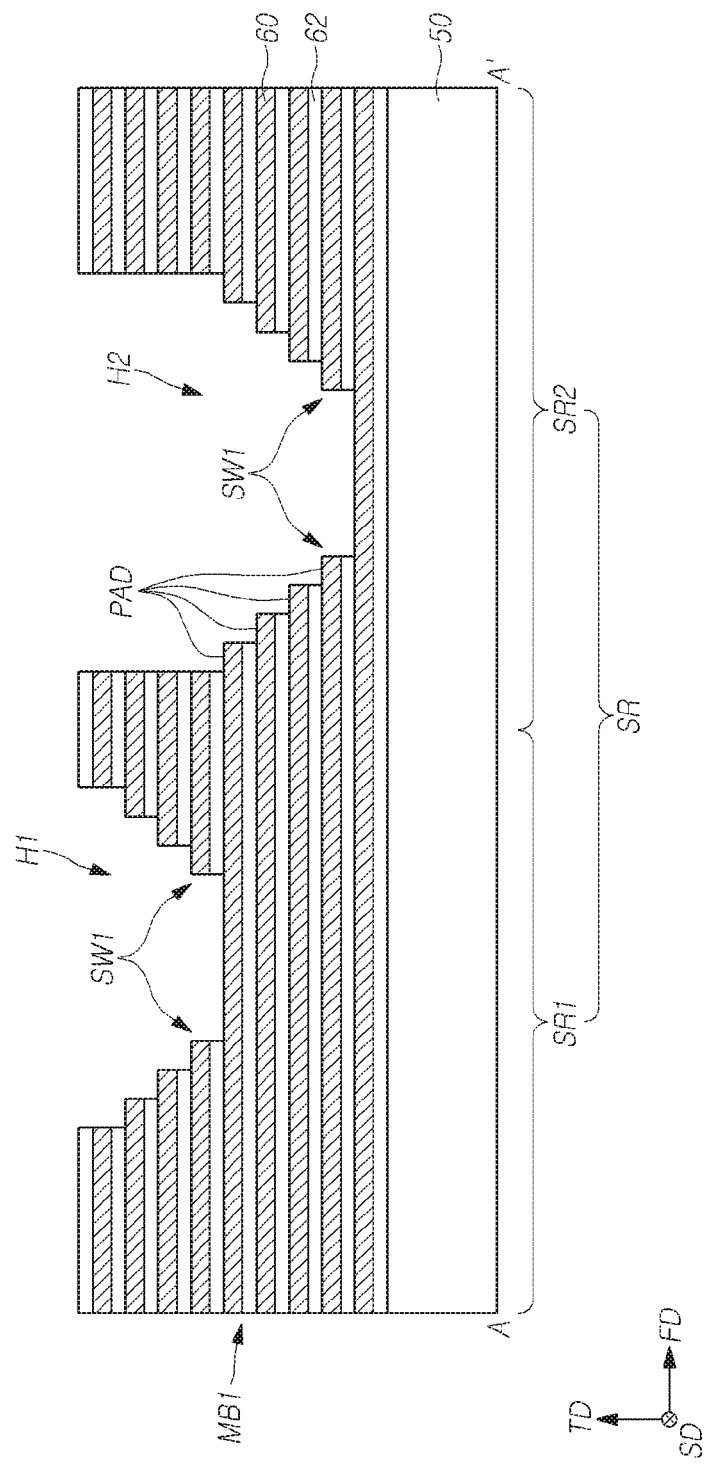
Figure 7:
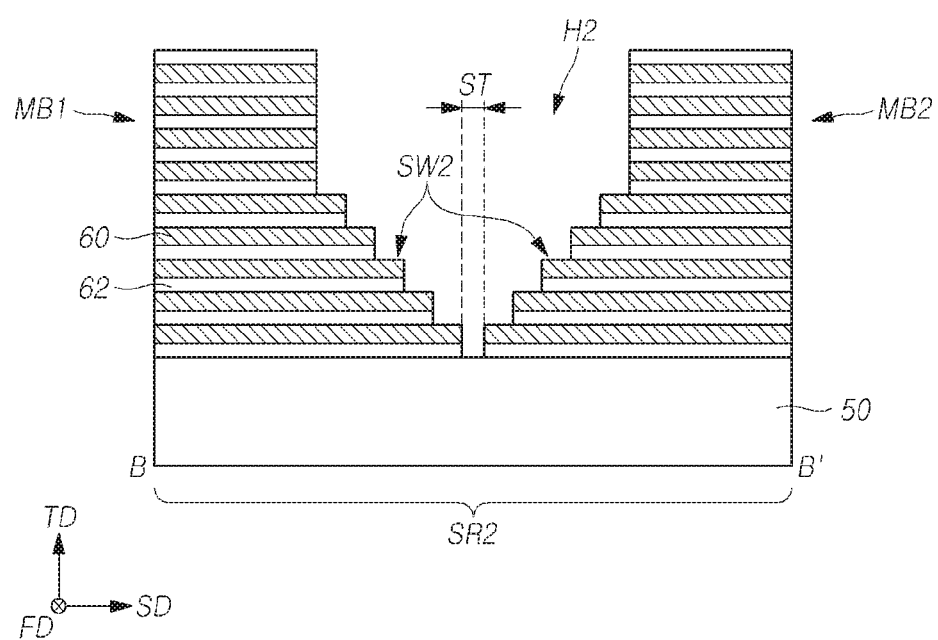
Figure 8:
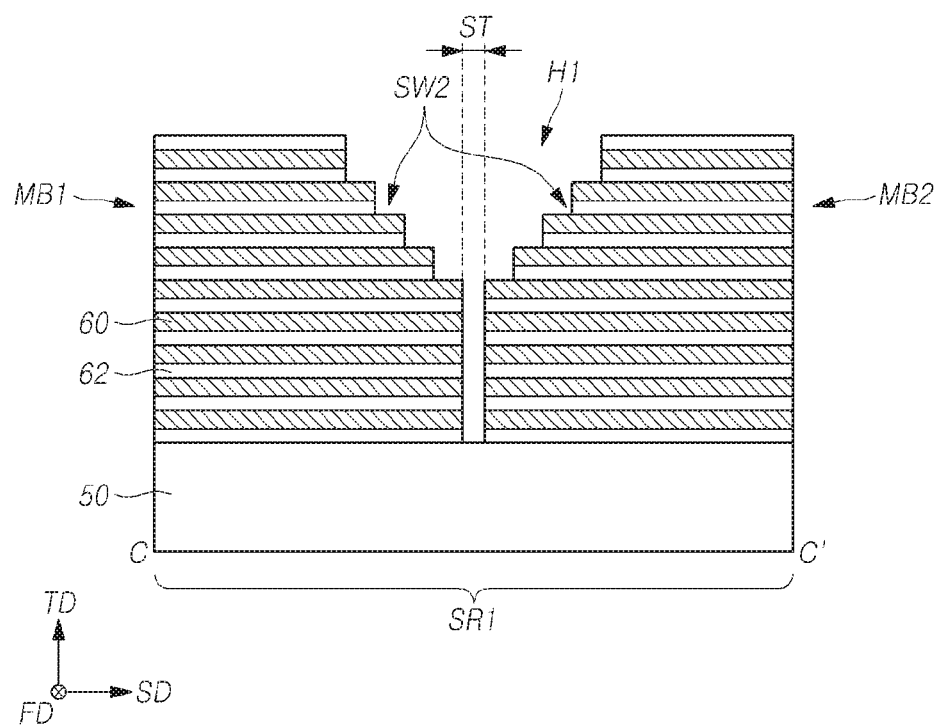
Figure 9:
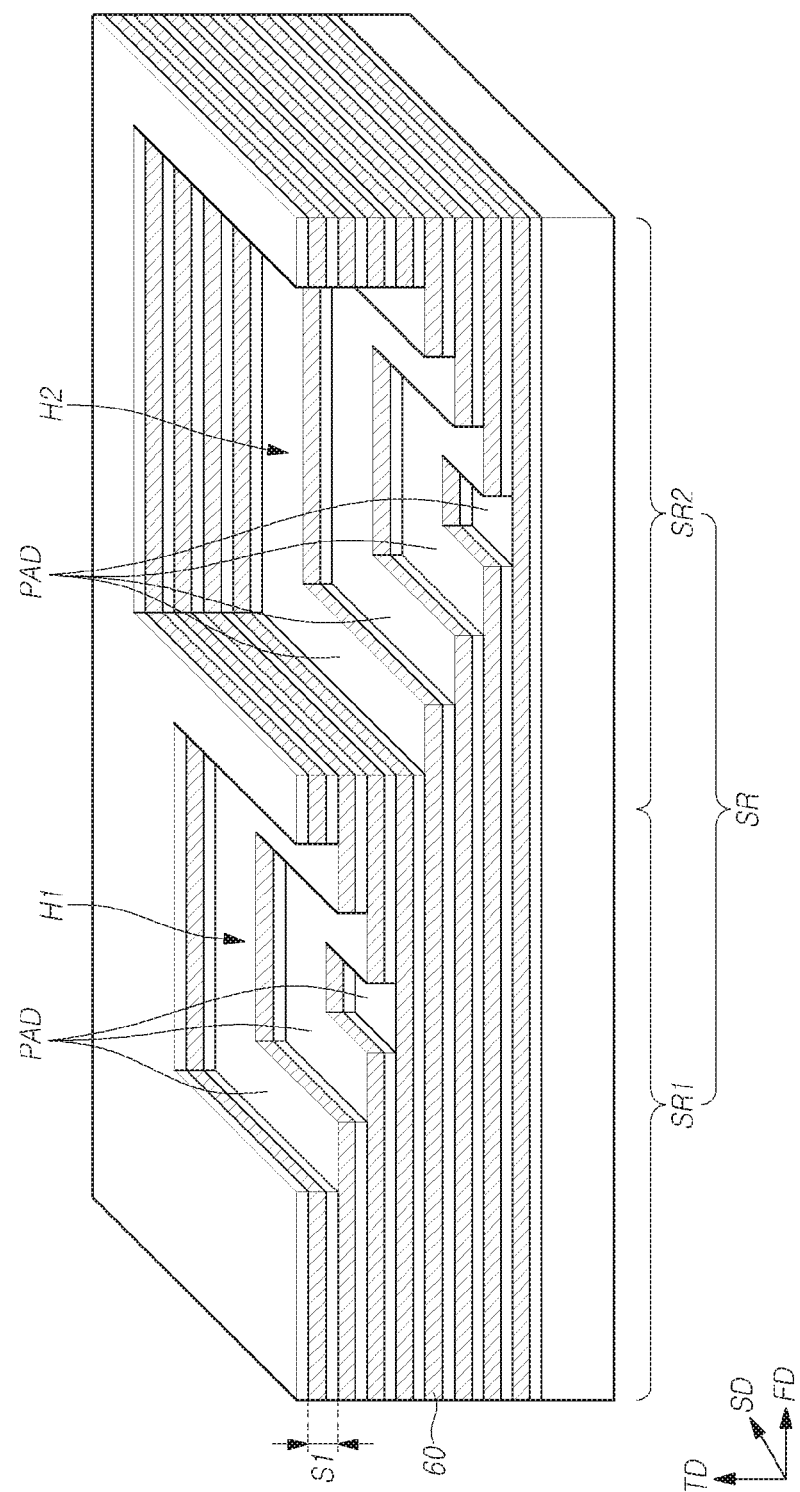

FIGS. 5 to 9 are simplified schematic illustrations of various views of a semiconductor memory device in accordance with an embodiment of the present disclosure. In detail, FIG. 5 is a top view illustrating a portion of a semiconductor memory device in accordance with an embodiment, FIG. 6 is a cross-sectional view taken along the line A-A' of FIG. 5, FIG. 7 is a cross-sectional view taken along the line B-B' of FIG. 5, FIG. 8 is a cross-sectional view taken along the line C-C' of FIG. 5, and FIG. 9 is a perspective view illustrating the part I of FIG. 5.

Referring to FIGS. 5 to 9, a substrate 50 may include a first cell region CR1, a slimming region SR which extends from the first cell region CR1 in the first direction FD, and a second cell region CR2 which extends from the slimming region SR in the first direction FD. The slimming region SR may be divided into a plurality of slimming regions SR1 and SR2 or simply regions SR1 and SR2 which are disposed in a line along the first direction FD. While it is illustrated in the present embodiment that the slimming region SR is divided into two regions, it is to be noted that the slimming region SR may be divided into at least three regions which are disposed in a line along the first direction FD. Hereafter, for the sake of convenience in explanation, the regions SR1 and SR2 will be defined as a first region SR1 and a second region SR2.

The substrate 50 may be formed of or include at least one selected from the group including a monocrystalline silicon layer, an SOI (silicon on insulator), a silicon layer formed on a silicon germanium (SiGe) layer, a monocrystalline silicon layer formed on a dielectric layer and a polysilicon layer formed on a dielectric layer.

A first electrode structure MB1 and a second electrode structure MB2 may be disposed on the substrate 50 in such a way as to be separated from each other in the second direction SD. The first and second electrode structures MB1 and MB2 may be separated from each other by a slit ST which extends along the first direction FD. The separation distance between the first electrode structure MB1 and the second electrode structure MB2 may be substantially the same as the width of the slit ST in the second direction SD.

Each of the first and second electrode structures MB1 and MB2 may include a plurality of electrodes 60 which are vertically stacked on the substrate 50. Interlayer dielectric layers 62 may be disposed over and under the electrodes 60. The electrodes 60 may be formed or include a conductive material. For example, the electrodes 60 may be formed or include a doped semiconductor, a metal, a conductive metal nitride or a transition metal. The interlayer dielectric layers 62 may be formed or include a dielectric material. For example, the interlayer dielectric layers 62 may be formed or include a silicon oxide. Channel structures CH penetrate through the electrodes 60 and the interlayer dielectric layers 62 in the first and second cell regions CR1 and CR2.

Each of the channel structures CH may include a channel layer and a gate dielectric layer. The channel layer may be formed of or include polysilicon or monocrystalline silicon, and may include a P-type impurity such as boron (B) in some regions. The channel layer may have the shape of a pillar or a solid cylinder which is completely filled up to its center. While not shown, the channel layer may have the shape of a tube in which a center region is open. In this case, a buried dielectric layer may be formed in the open center region of the channel layer. The gate dielectric layer may have the shape of a straw or a cylindrical shell which surrounds the outer wall of the channel layer. While not shown, the gate dielectric layer may include a tunnel dielectric layer, a charge storage layer and a blocking layer which are sequentially stacked from the outer wall of the channel layer. The gate dielectric layer may have an ONO (oxide-nitride-oxide) stack structure in which an oxide layer, a nitride layer and an oxide layer are sequentially stacked.

A plurality of step-shaped holes H1 and H2 may be formed along the first direction FD in the slimming region SR. Each of the step-shaped holes H1 and H2 may be vertically formed in a portion of the first electrode structure MB1 and a portion of the second electrode structure MB2. Each of the holes H1 and H2 is split in two portions by the slit ST. The two portions of the holes H1 and H2 splited by the slit SLT may be symmetrical to each other.

The first and second electrode structures MB1 and MB2 may have first side surfaces which face each other and second side surfaces which face away from the first side surfaces. The first and second step-shaped holes H1 and H2 may be formed to communicate with the slit ST. The first and second step-shaped holes H1 and H2 may be formed from the first side surfaces of the first and second electrode structures MB1 and MB2 facing each other and have a width extending from the first side surfaces of the first and second electrode structures MB1 and MB2 toward the second side surfaces of the first and second electrode structures MB1 and MB2 in the second direction SD, however, they may not reach the second side surfaces of the first and second electrode structures MB1 and MB2. The second side surfaces of the first and second electrode structures MB1 and MB2 are not formed with the first and second step-shaped holes H1 and H2. All the electrodes 60 included in the first and second electrode structures MB1 and MB2 are not completely divided into a plurality of separate structures by the first and second step-shaped holes H1 and H2. The second step-shaped holes H2 may penetrate deeper through the first and second electrode structures MB1 and MB2 than the first step-shaped holes H1 as shown, for example, in FIG. 6.

The first and second step-shaped holes H1 and H2 may have an inverted pyramid shape and may be formed to have different depths. Step structures may be formed on the sidewalls of the first and second step-shaped holes H1 and H2. In detail, each of the first and second step-shaped holes H1 and H2 may have a pair of first step structures SW1 which face each other in the first direction FD and are symmetrical to each other and a pair of second step structures SW2 which face each other in the second direction SD and are symmetrical to each other. One of the pair of second step structures SW2 may be formed in the first electrode structure MB1 and the other of the pair of second step structures SW2 may be formed in the second electrode structure MB2. The pair of first step structures SW1 may extend along the second direction SD between the second step structure SW2 formed in the first electrode structure MB1 and the second step structure SW2 formed in the second electrode structure MB2, and may be divided by the slit ST. Each of the first and second step-shaped holes H1 and H2 may be a structure which is symmetrical with respect to the slit ST.

Each of the first step structures SW1 and the second step structures SW2 may include a plurality of steps S1 which have the same height. The height of each of the steps S1 may have a size corresponding to the vertical pitch of the electrodes 60.

In each of the first and second step-shaped holes H1 and H2, each of the electrodes 60 may have a pad region PAD which is not covered but it is left exposed by an electrode 60 positioned on it. When viewed from the top, the pad regions PAD of the electrodes 60 may be disposed at different positions in the first direction FD and the second direction SD. The horizontal distances of the pad regions PAD of the electrodes 60 from the centers of the step-shaped holes H1 and H2 in which they are positioned may increase as the vertical distances thereof from the substrate 50 increase.

Referring to FIG. 9, in the present embodiment, pad regions PAD which are positioned at the respective bottom of the first step-shaped hole H1 and the second step-shaped hole H2 may have a quadrangular planar structure. The remaining pad regions PAD may each have a substantially U-shaped planar structure. Each of the remaining pad regions PAD may have a first portion (base portion) which extends in the first direction FD and a pair of second portions (legs) which extend in the second direction SD from both ends of the first portion to form a U shape. In the remaining pad regions PAD, the length of the first portion in the first direction FD and the length of the second portions in the second direction SD may be lengthened as the horizontal distances of the remaining pad regions PAD from the centers of the first step-shaped hole H1 and the second step-shaped hole H2 increase. While not shown, contact plugs which extend vertically may be coupled to the respective pad regions PAD.

As is apparent from the above descriptions, according to the present embodiment, the electrodes 60 are not divided in the slimming region SR. Therefore, wiring lines for coupling separated electrodes 60 are not needed. As a consequence, when compared to the case where electrodes are divided, since the number of entire wiring lines needed in a semiconductor memory device is reduced, the margin of a wiring line forming process may be improved. Also, when viewed from the top, because the pad regions PAD of the electrodes 60 are disposed at different positions in the first direction FD and the second direction SD, contact plugs to be coupled to the pad regions PAD may be disposed at different positions in the first direction FD and the second direction SD. Thus, when compared to the case where pad regions PAD are disposed in only the first direction FD and contact plugs to be coupled to the pad regions PAD should be disposed along only the first direction FD, it is possible to increase the gap between the contact plugs and, thus, it is possible to suppress the occurrence of a fail due to adjacent contact plugs becoming short-circuited. Further, since it is not necessary to form the pad regions PAD to have a wide width in the first direction FD so as to prevent contact plugs from being short-circuited, it is possible to reduce the width of the slimming region SR in the first direction FD, whereby it is possible to provide a semiconductor memory device of a reduced size.

Figure 10A:
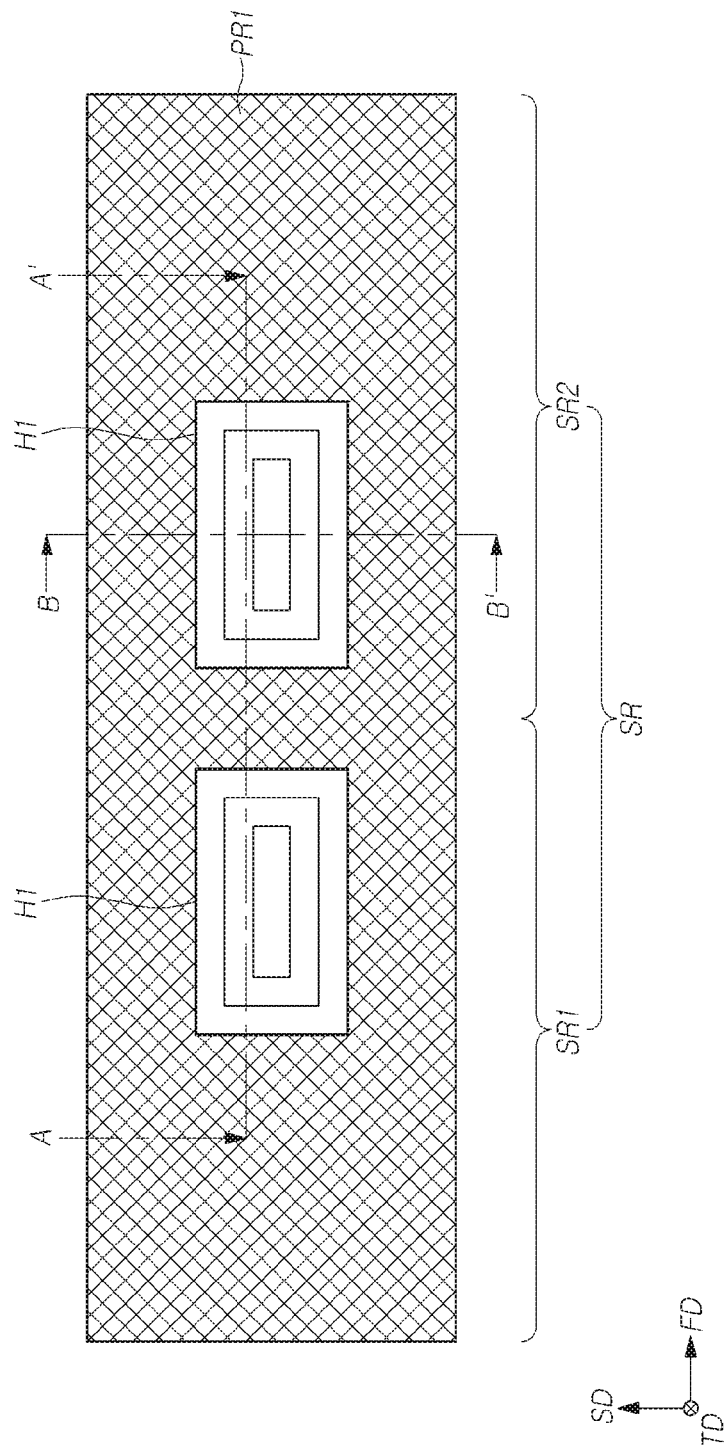

FIGS. 10A to 11C are simplified schematic illustrations of various views of a method for forming the semiconductor memory device described above with reference to FIGS. 5 to 9. In detail, FIGS. 10A and 11A illustrate planar structures in respective manufacturing steps, FIGS. 10B and 11B illustrate cross-sections taken along the lines A-A' of FIGS. 10A and 11A, and FIGS. 10C and 11C illustrate cross-sections taken along the lines B-B' of FIGS. 10A and 11A.

Figure 10B:
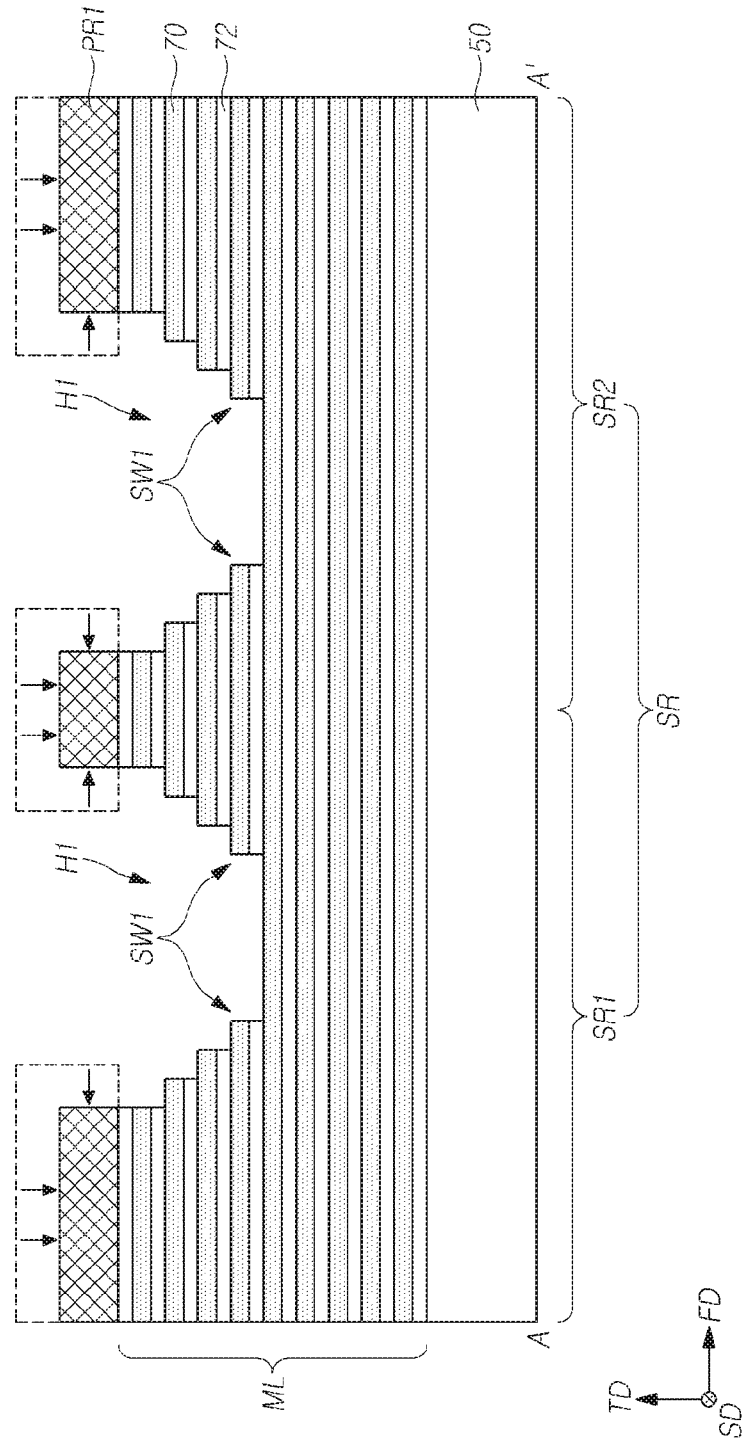
Figure 10C:
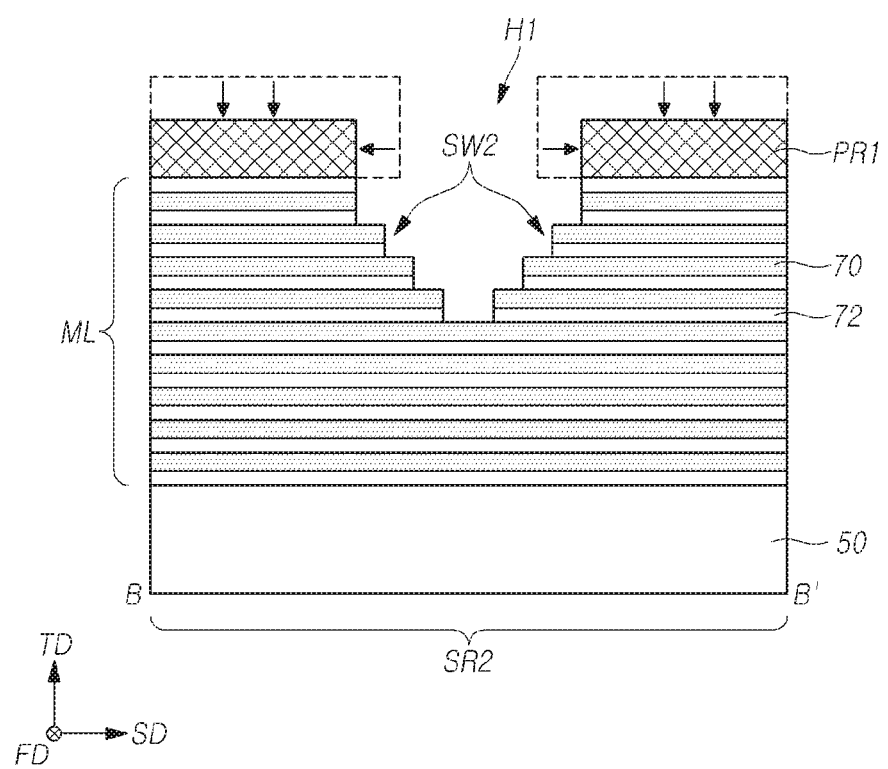

Referring to FIGS. 10A to 10C, a stack ML is formed by alternately stacking first and second materials 70, 72 on a substrate 50 which includes a first cell region (CR1 of FIG. 5), a slimming region SR extending from the first cell region CR1 in the first direction FD and a second cell region (CR2 of FIG. 5) extending from the slimming region SR in the first direction FD.

The slimming region SR may be divided into a plurality of slimming regions SR1 and SR2 which are disposed in a line along the first direction FD. In the present embodiment, it is illustrated as an example that the slimming region SR is divided into a first region SR1 and a second region SR2.

The first material layers 70 and the second material layers 72 may be formed of different materials. For example, the second material layers 72 may be formed of a dielectric material for interlayer dielectric layers, and the first material layers 70 may be formed of a dielectric material which is used as sacrificial material and has an etching selectivity with respect to the second material layers 72. For example, the first material layers 70 may be formed of silicon nitride, and the second material layers 72 may be formed of silicon oxide.

Then, by etching the stack ML, a plurality of first step-shaped holes H1 which are disposed in a line along the first direction FD are formed. The first step-shaped holes H1 may be disposed in the first and second regions SR1 and SR2, respectively. Each of the first step-shaped holes H1 may have a pair of first step structures SW1 facing each other in the first direction FD and are symmetrical to each other and a pair of second step structures SW2 facing each other in the second direction SD and are symmetrical to each other. The first step-shaped holes H1 may be formed through processes to be described below.

First, a first hole type mask pattern PR1 including first opening holes which respectively expose portions of the first and second regions SR1 and SR2 is formed on the stack ML. Then, the first step-shaped holes H1 are formed by alternately performing a plurality of pad etching processes and a plurality of trimming processes. In each of the pad etching processes, the stack ML may be etched by a first etching depth by using the first hole type mask pattern PR1 as an etch barrier. In each of the trimming processes, the widths of the first opening holes of the first hole type mask pattern PR1 in the first direction FD and the second direction SD may be increased. The first etching depth may correspond to the vertical pitch of the first material layers 70. In the present embodiment, the first step structures SW1 and the second step structures SW2 may have the same number of steps.

The first hole type mask pattern PR1 may be formed using a photolithography process, and may be removed after forming the first step-shaped holes H1.

Figure 11C:
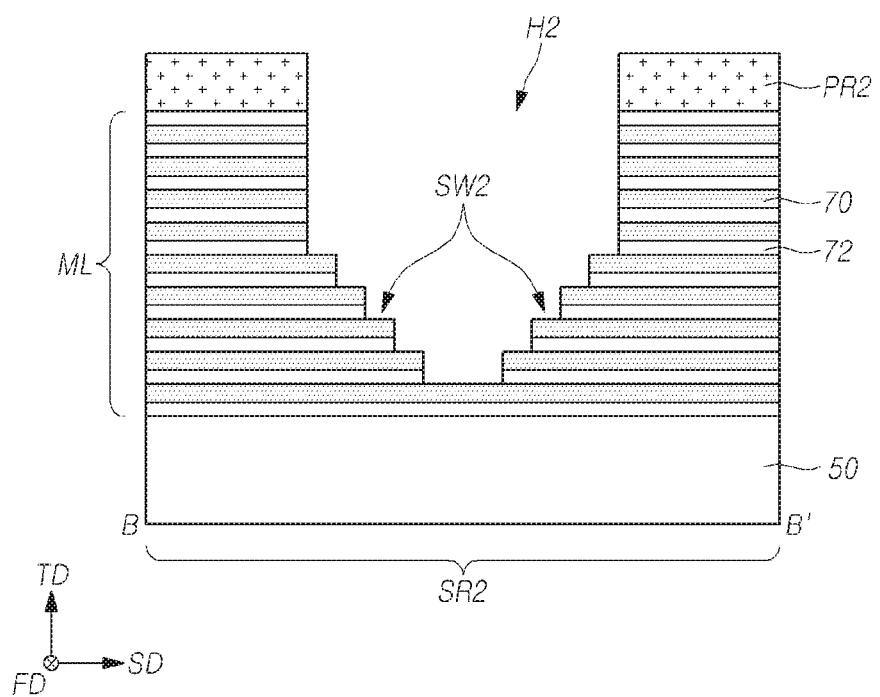

Referring to FIGS. 11A to 11C, a second step-shaped hole H2 is formed by recessing one of the first step-shaped holes H1, for example, the first step-shaped hole H1 of the second region SR2. The second step-shaped hole H2 may be formed through processes to be described below.

First, a second hole type mask pattern PR2 having a second opening hole which opens the first step-shaped hole H1 formed in the second region SR2, by a first area, is formed on the stack ML which is formed with the first step-shaped holes H1. The first area may be larger than the opening area of the first opening hole. Then, the second step-shaped hole H2 is formed by etching the stack ML such that the first step-shaped hole H1 exposed by the second hole type mask pattern PR2 is recessed.

The second hole type mask pattern PR2 may be formed using a photolithography process, and may be removed after forming the second step-shaped hole H2.

Thereafter, while not shown, the stack ML is divided by forming a slit (ST of FIGS. 5 and 7 to 8) which vertically passes through the stack ML and traverses the first and second step-shaped holes H1 and H2 in the first direction FD.

Then, channel structures (CH of FIG. 5) which vertically pass through the stack ML are formed in the first and second cell regions CR1 and CR2, and the first material layers 70 which are used as sacrificial layers are removed. After that, by filling an electrode material in spaces which are formed by removing the first material layers 70, electrodes (60 of FIGS. 6 and 7) are formed. In this way, the first and second electrode structures MB1 and MB2 of FIGS. 5 to 9 are formed.

As is apparent from the above descriptions, according to the present embodiment, it is possible to prevent the electrodes 60 of the first and second electrode structures MB1 and MB2 from being divided, even without using an additional mask in the pad etching process.

Figure 12:
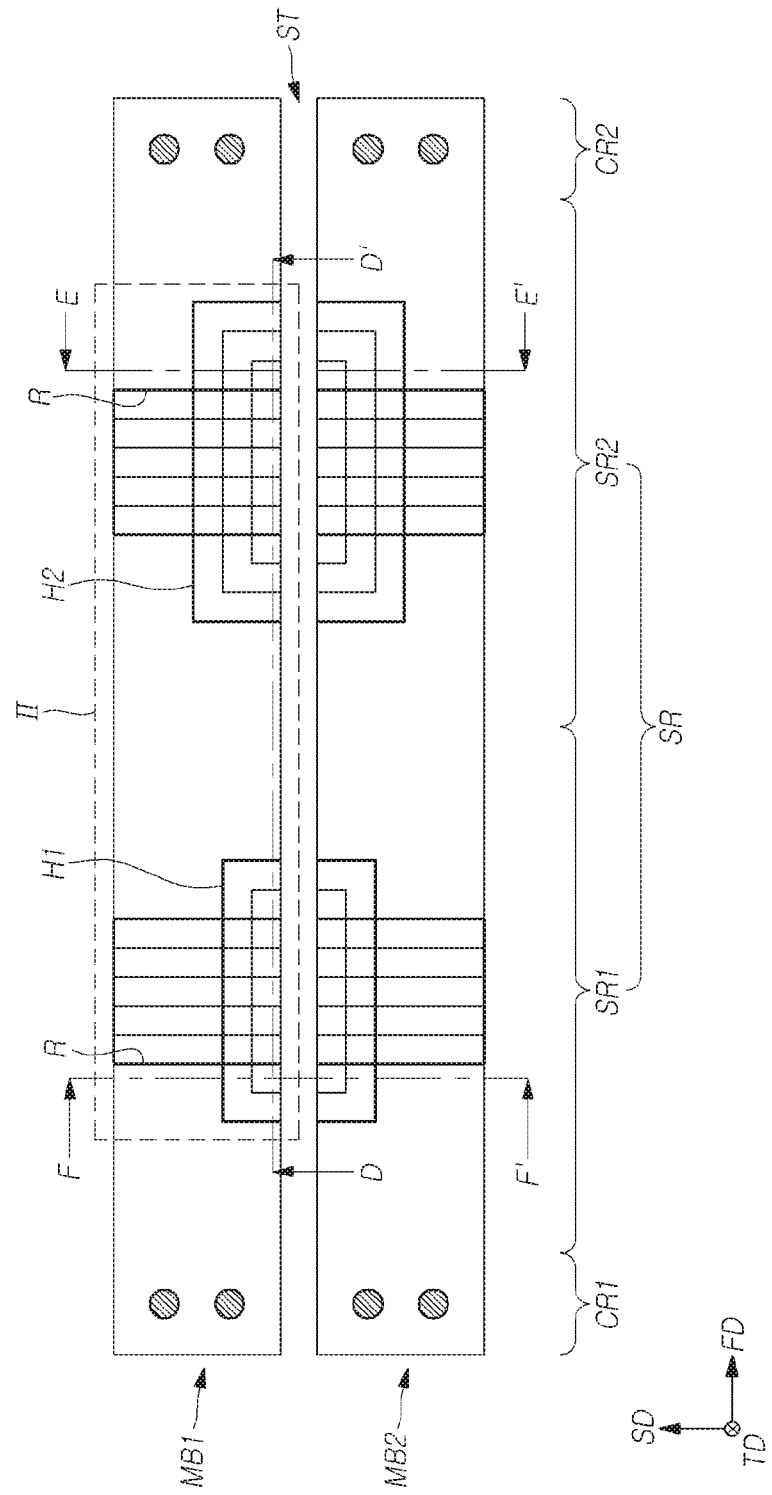
FIGS. 12 to 16 are simplified schematic illustrations of various views of a semiconductor memory device in accordance with an embodiment of the present disclosure.
Figure 13:
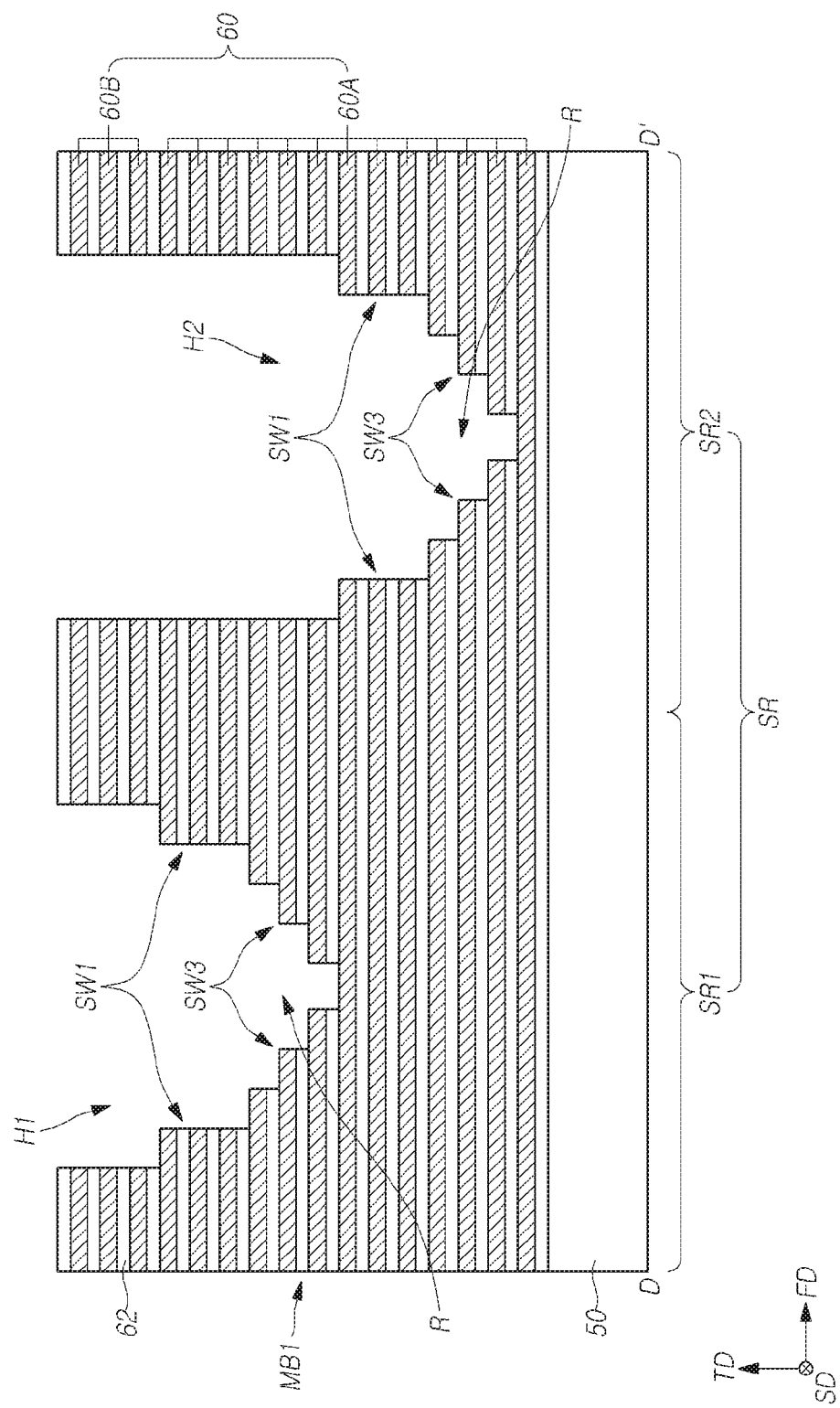
Figure 14:
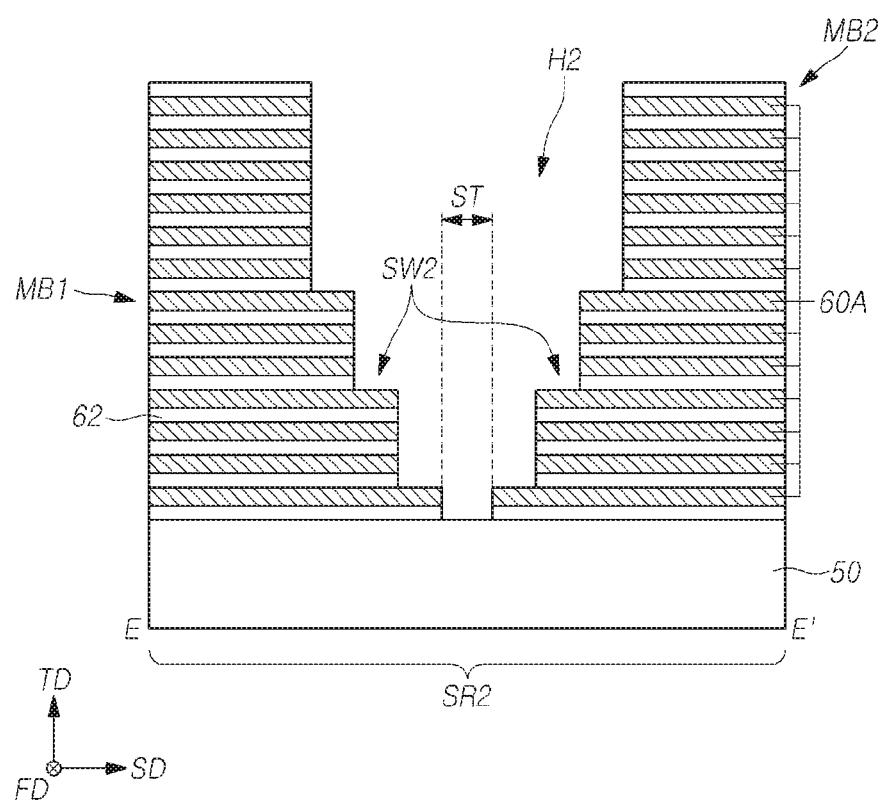
Figure 15:
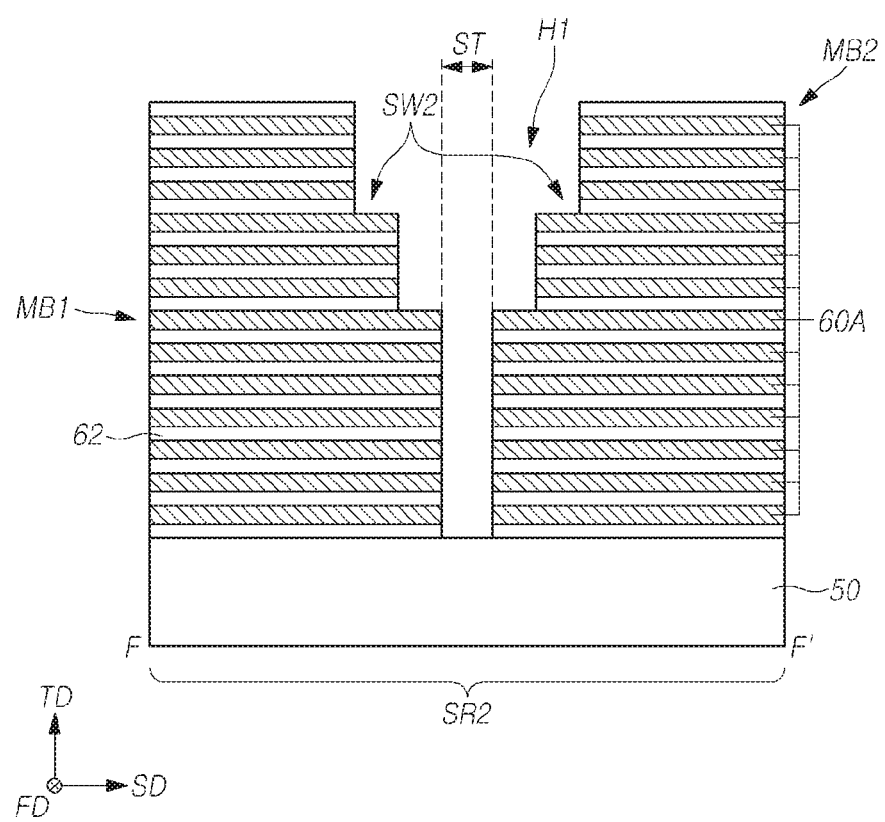
Figure 16:
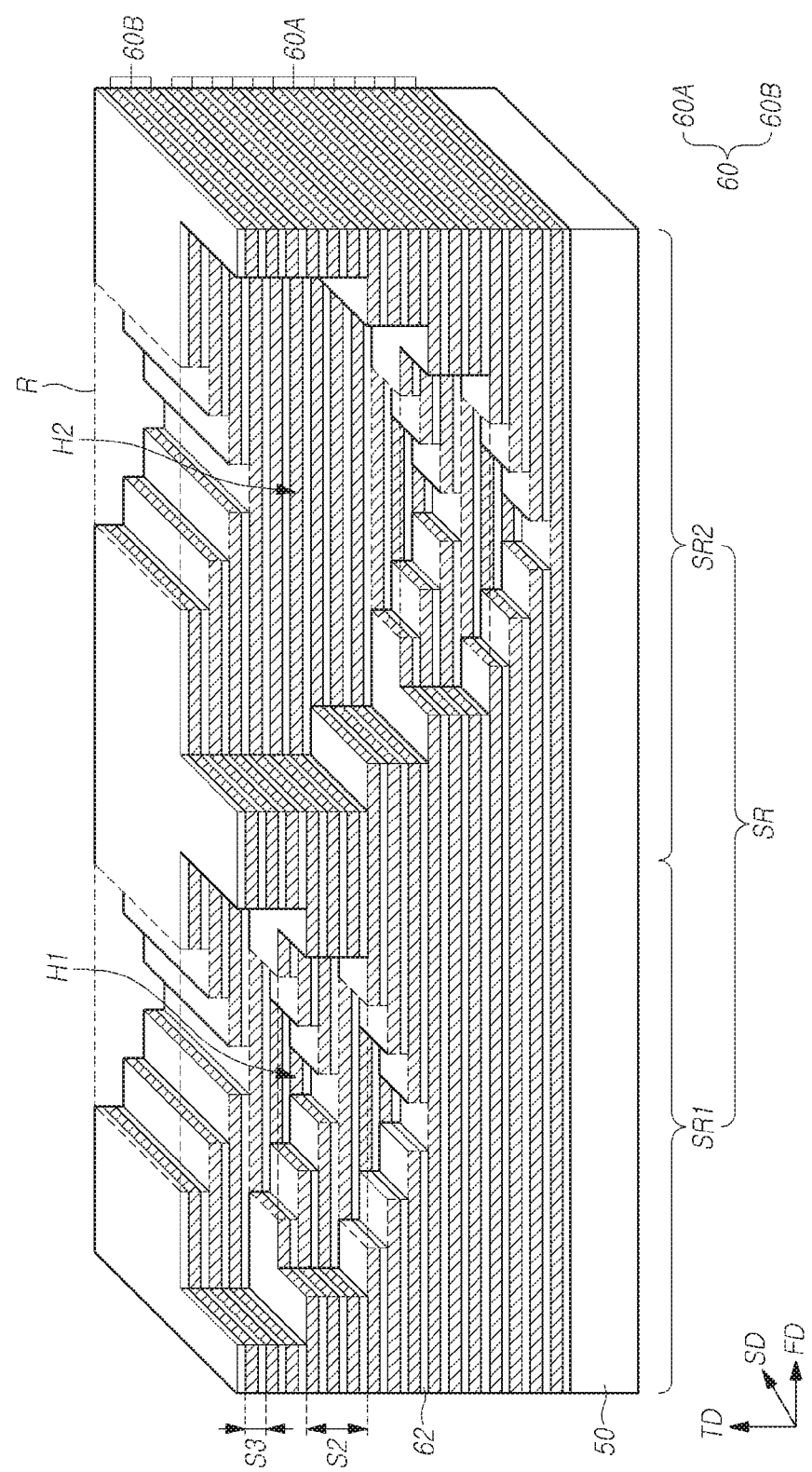
Figure 17A:
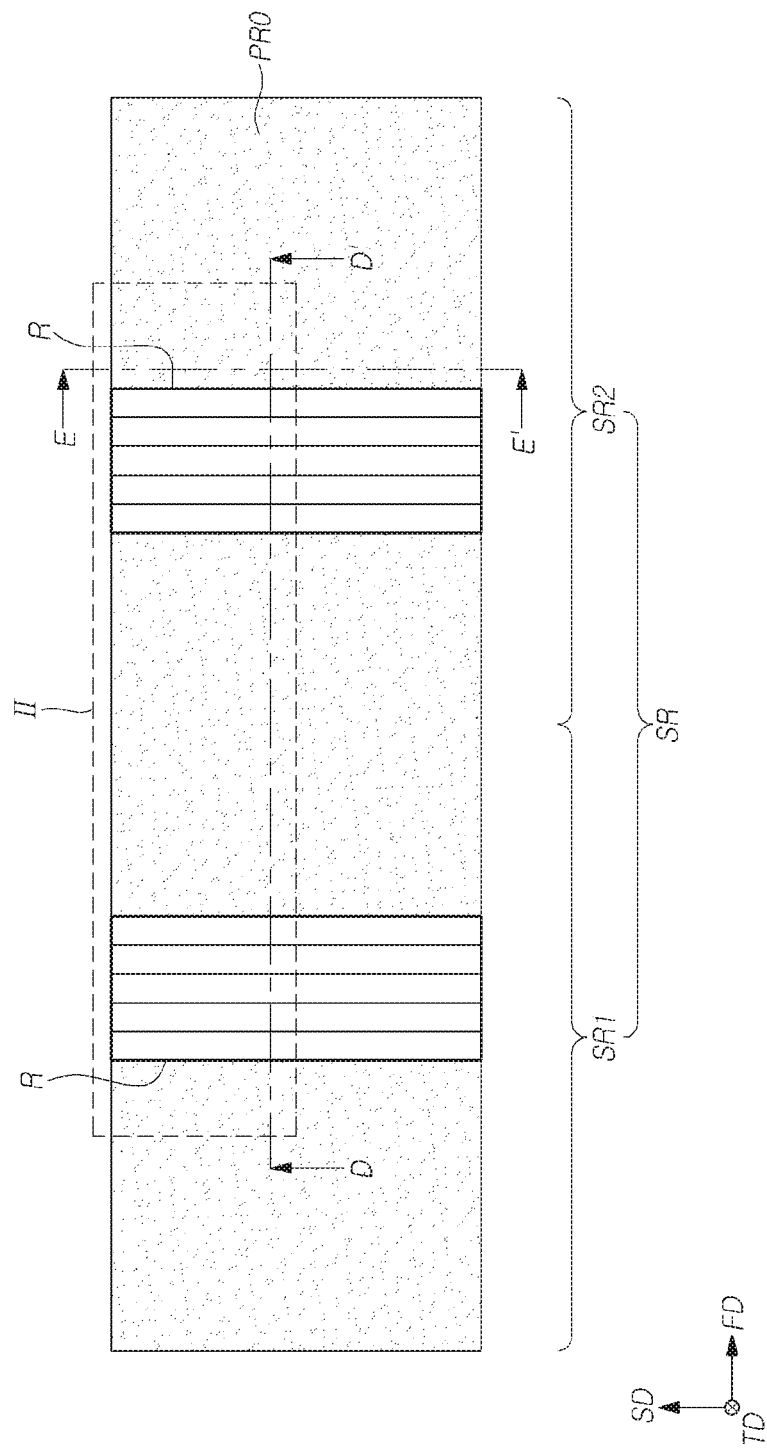
FIGS. 17A to 19D are simplified schematic illustrations of various views of a method for forming a semiconductor memory device in accordance with an embodiment of the present disclosure.
Figure 17B:
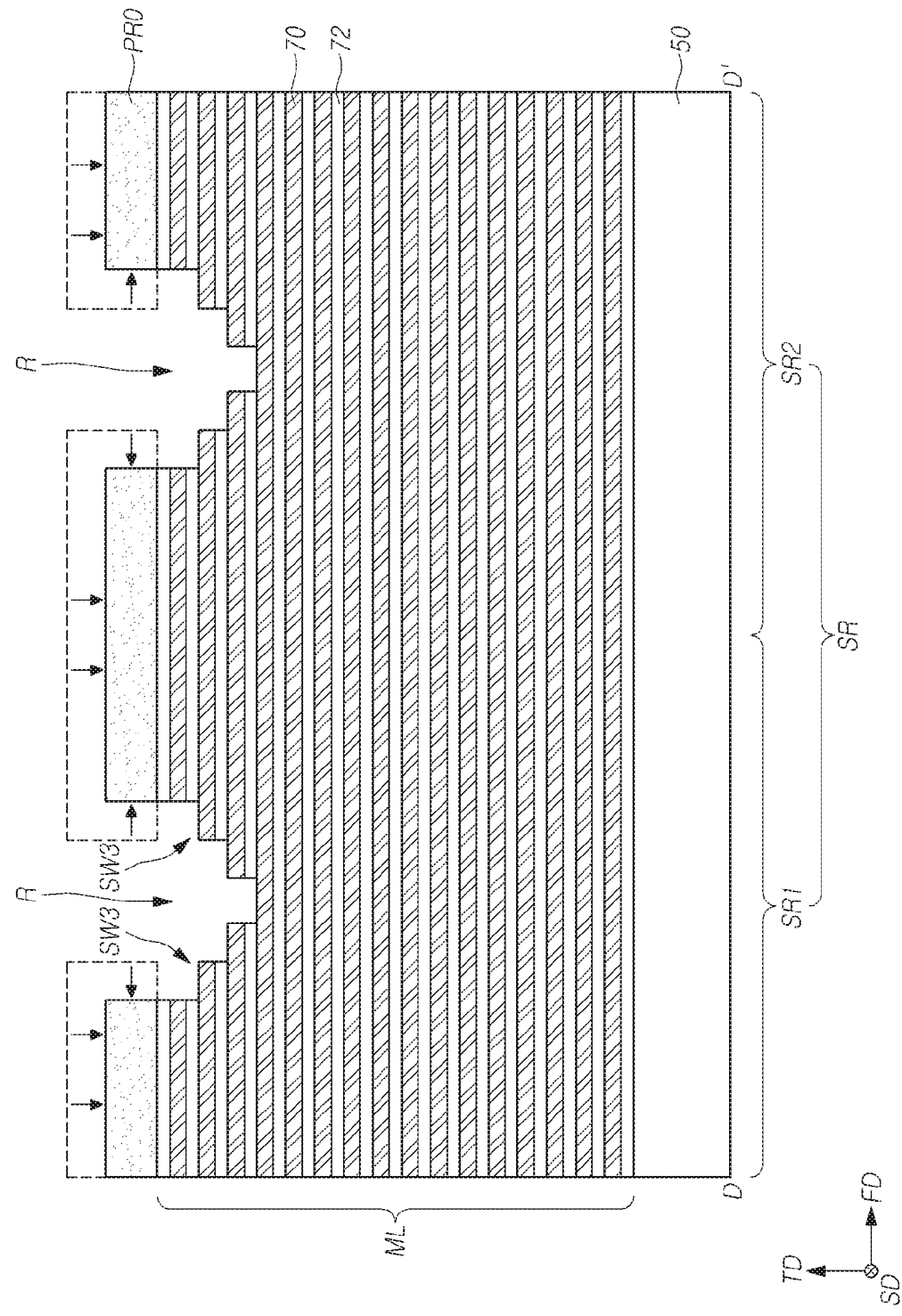
Figure 17C:
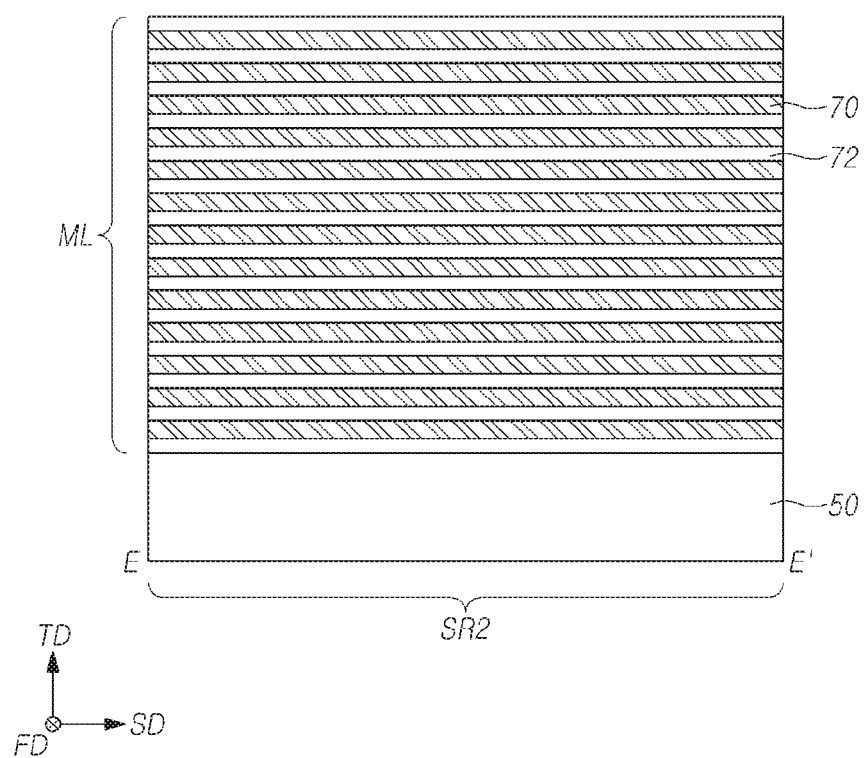
Figure 17D:
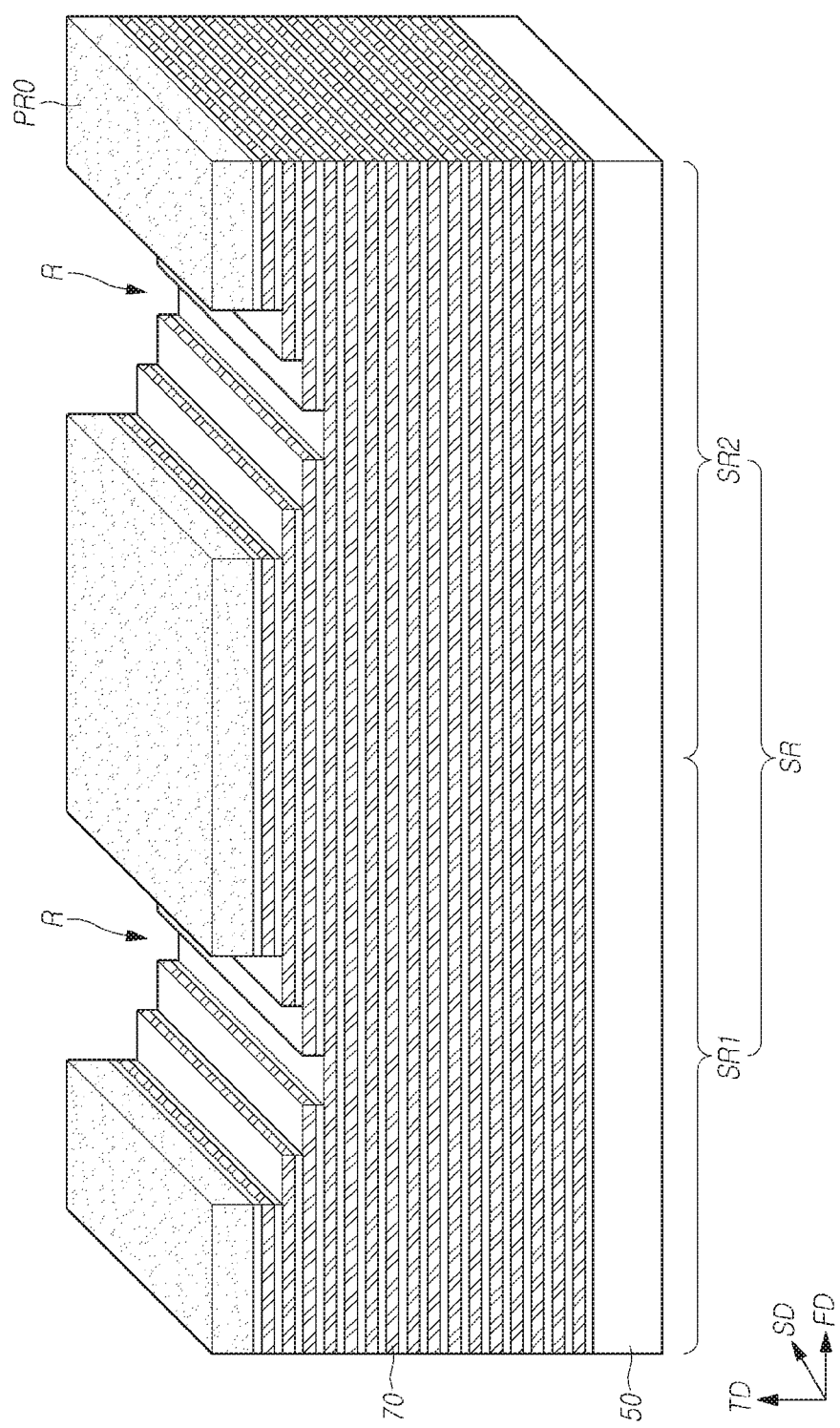
Figure 18C:
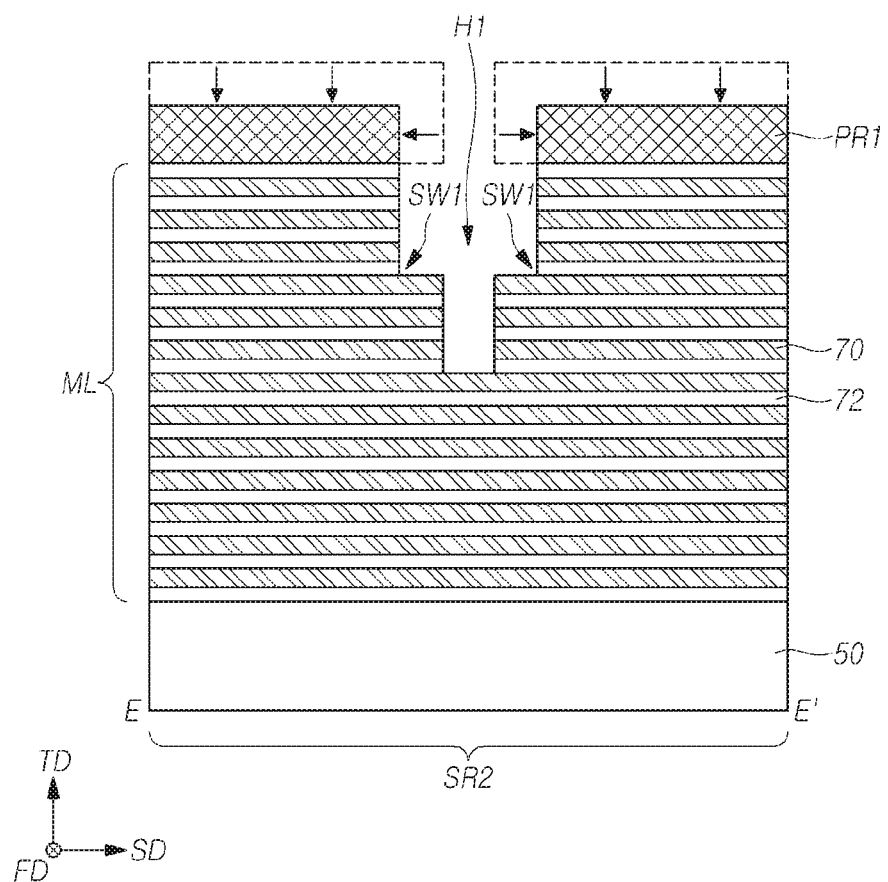
Figure 18D:
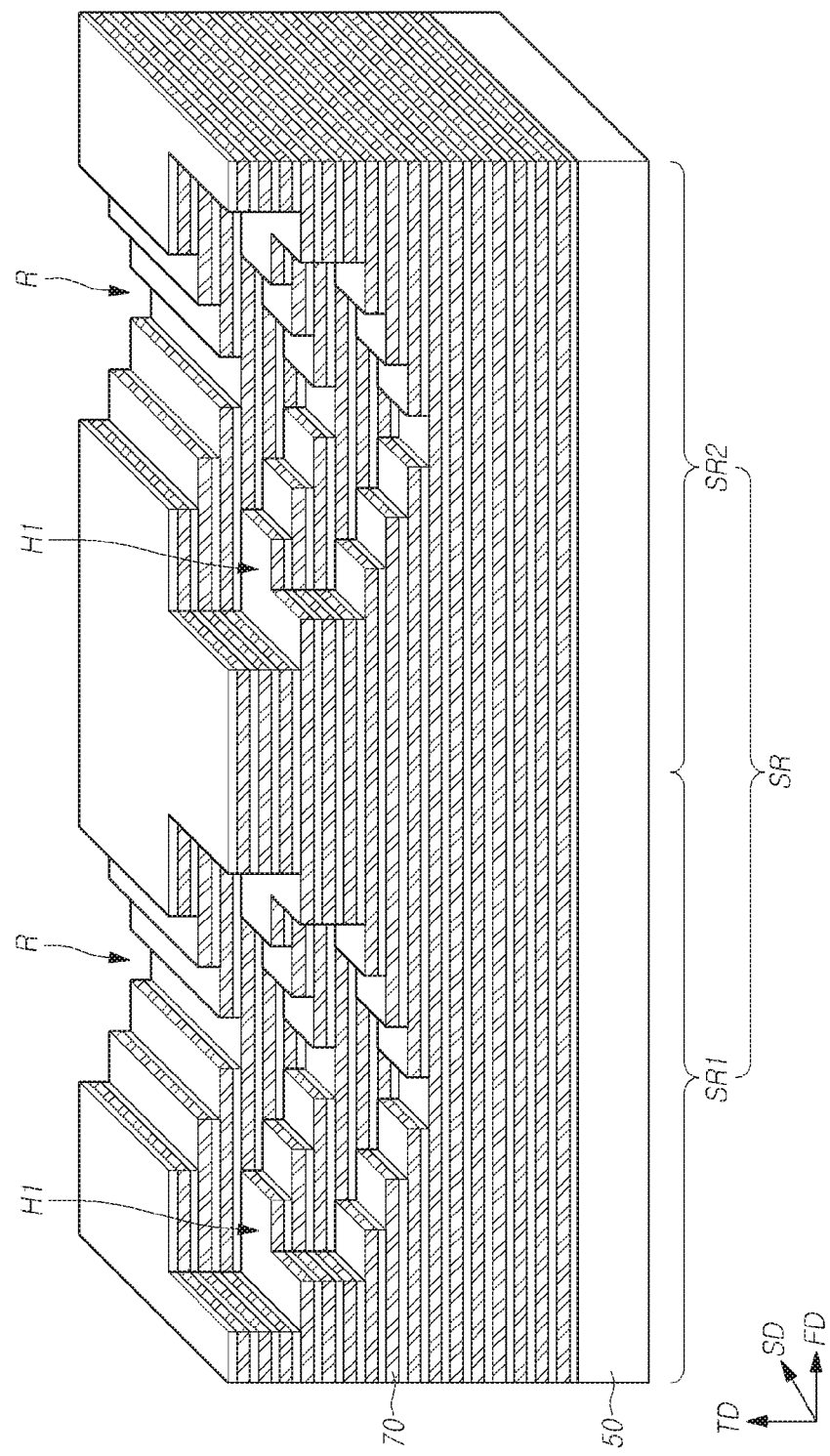
Figure 19A:
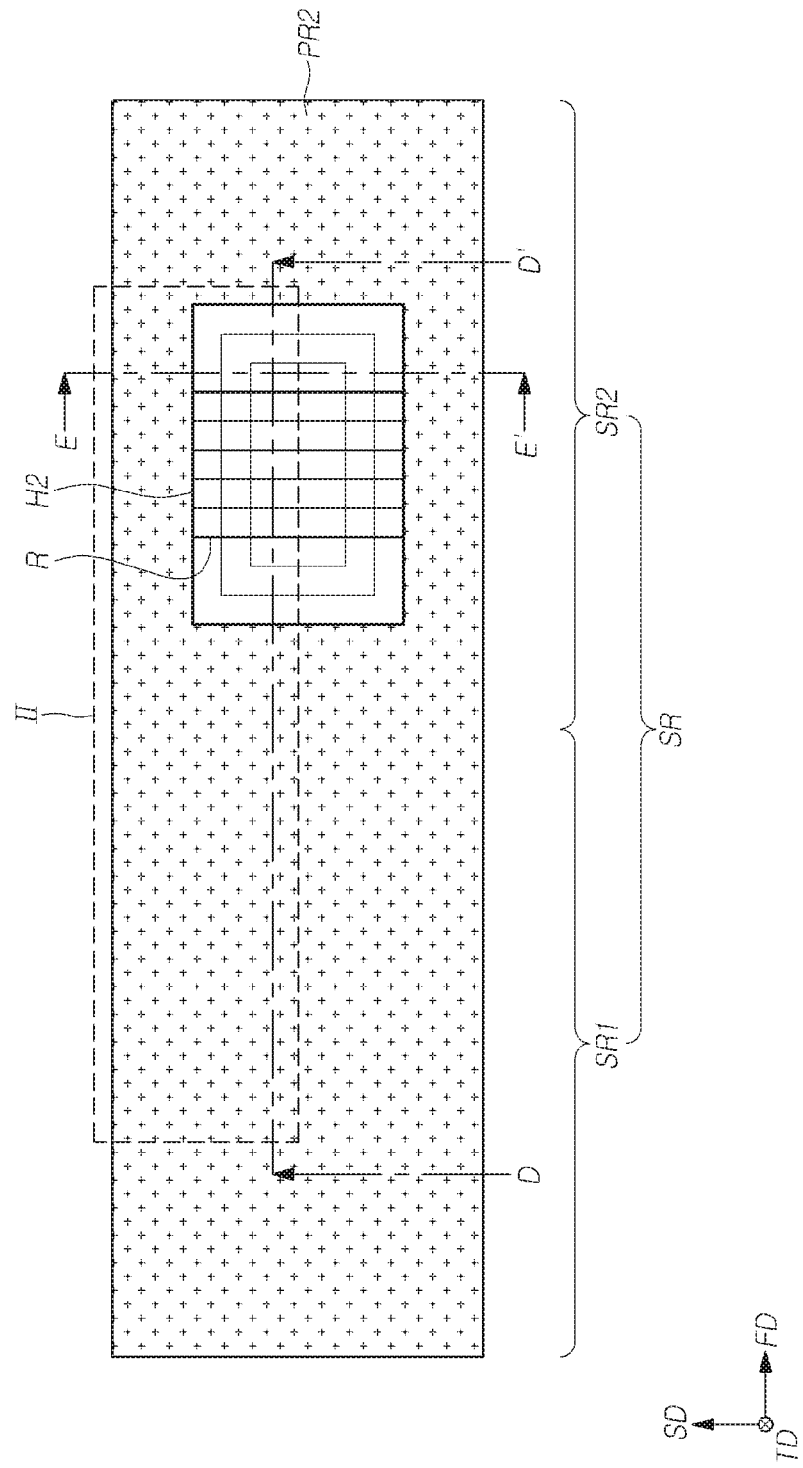
Figure 19B:
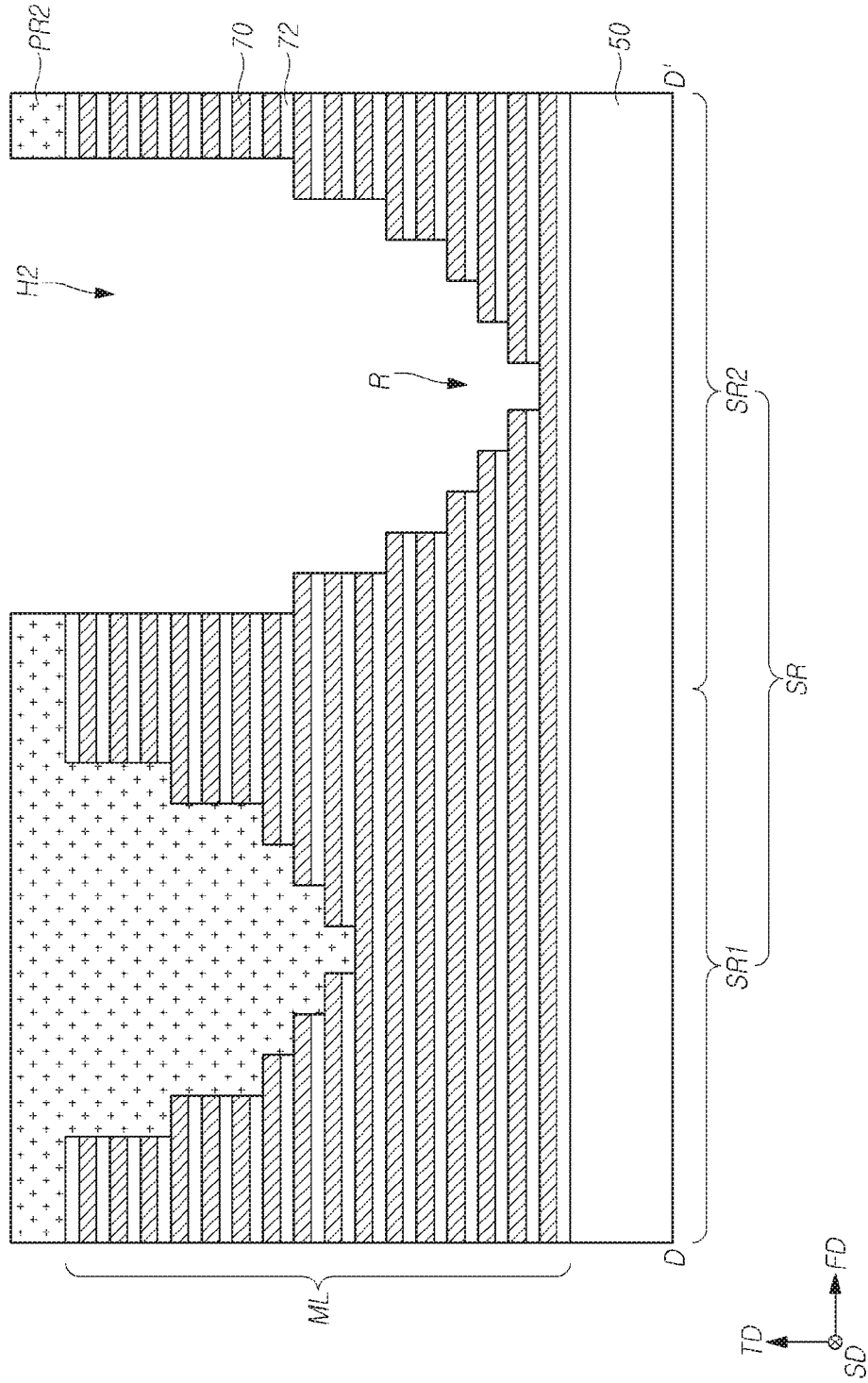
Figure 19C:
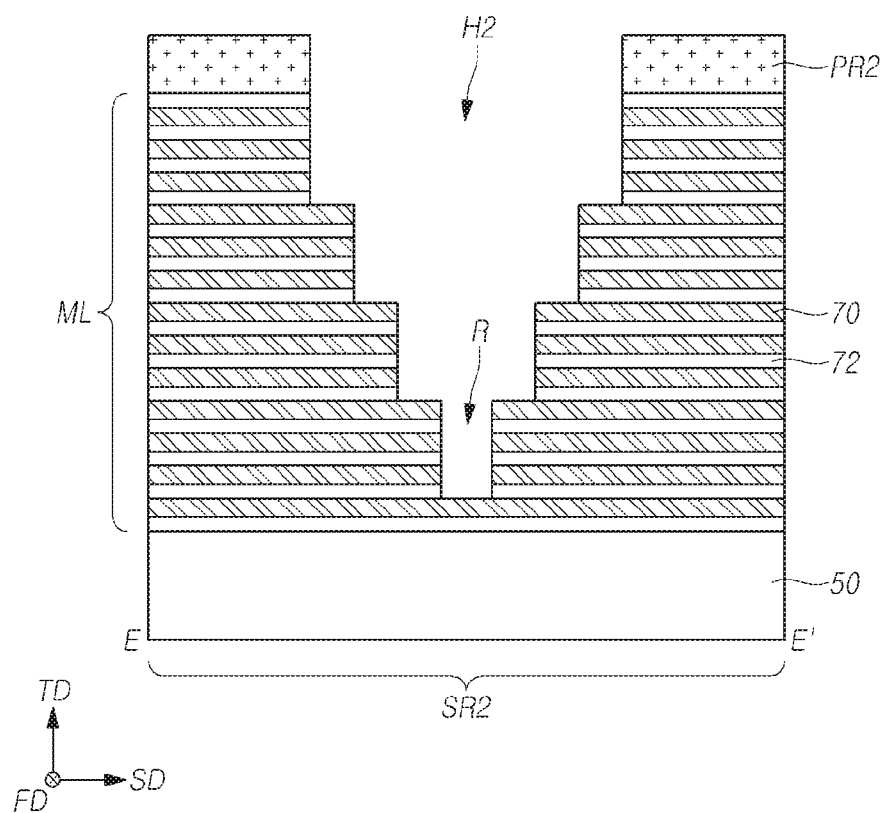
Figure 19D:
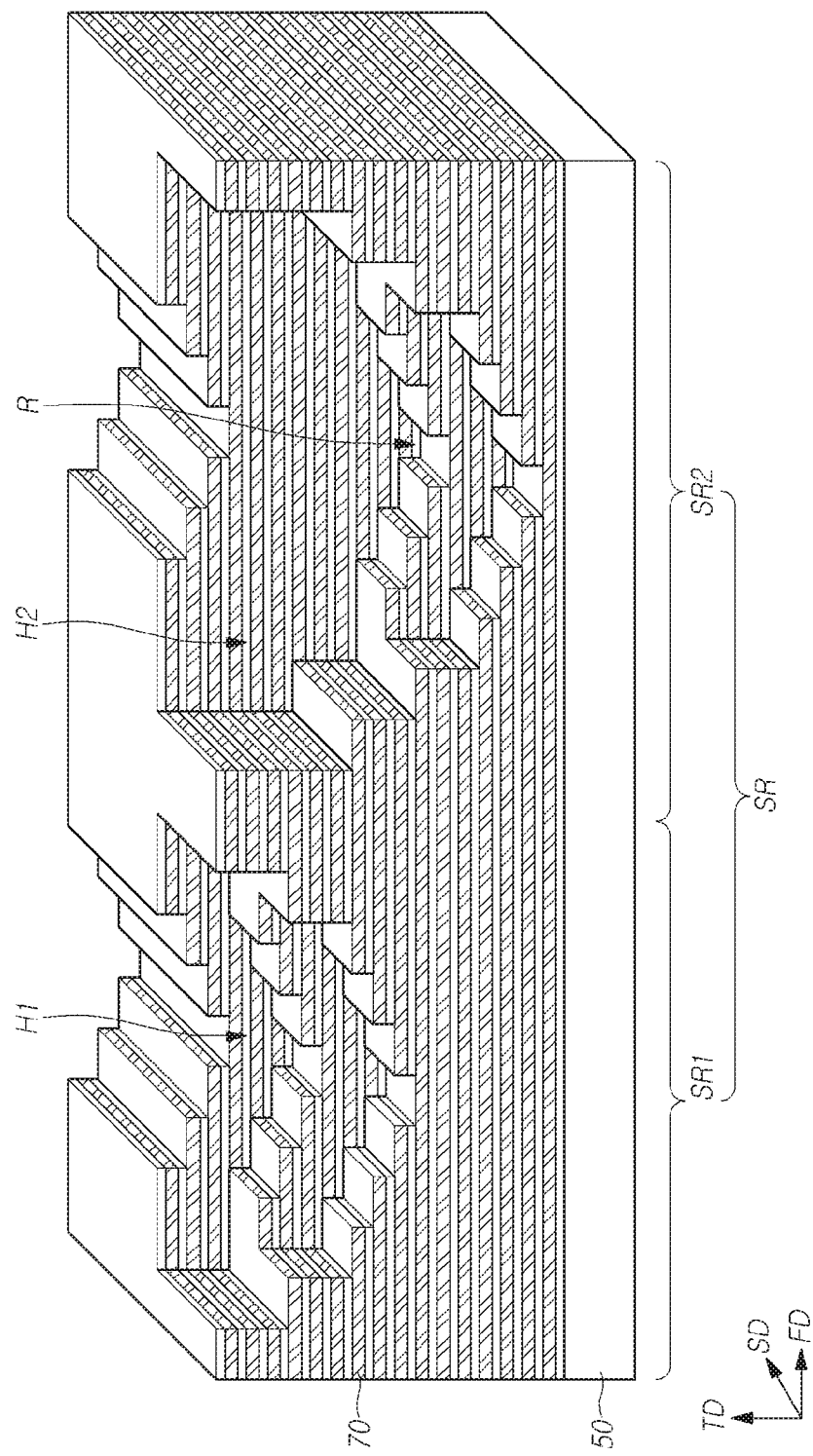

FIGS. 12 to 16 are simplified schematic illustrations of various views of a semiconductor memory device in accordance with an embodiment of the present disclosure In detail, FIG. 12 is a top view illustrating a portion of a semiconductor memory device in accordance with an embodiment, FIG. 13 is a cross-sectional view taken along the line D-D' of FIG. 12, FIG. 14 is a cross-sectional view taken along the line E-E' of FIG. 12, FIG. 15 is a cross-sectional view taken along the line F-F' of FIG. 12, and FIG. 16 is a perspective view illustrating the part II of FIG. 12.

In the following descriptions to be made with reference to FIGS. 12 to 16, repeated descriptions for configurations the same as those of the embodiment described above with reference to FIGS. 5 to 9 will be omitted.

Referring to FIGS. 12 to 16, when compared to the embodiment described above with reference to FIGS. 5 to 9, the present embodiment may further include step-shaped trenches R which vertically penetrate portions of the electrodes 60.

Referring to FIGS. 12 to 16, when viewed from the top, the step-shaped trenches R may be disposed to traverse the entire length of the first and second electrode structures MB1 and MB2 in the second direction SD and intersect with the first and second step-shaped holes H1 and H2, respectively. Portions of the step-shaped trenches R may overlap with the first and second step-shaped holes H1 and H2. The other portions of the step-shaped trenches R which do not overlap with the first and second step-shaped holes H1 and H2 may vertically penetrate electrodes 60 stacked at upper parts. And, the other portions of the step-shaped trenches R which do not overlap with the first and second step-shaped holes H1 and H2 may divide the electrodes 60 which are stacked at upper parts into a plurality of separate structures. In the present embodiment, it is illustrated that three electrodes 60 stacked at upper parts are divided into plurality of separate structures by the step-shaped trenches R. The remaining electrodes 60 except the three electrodes 60 stacked at upper parts are not divided into a plurality of separate structures in spite of the presence of the trenches R.

The electrodes 60 may include first electrodes 60A which are not divided by the step-shaped trenches R and second electrodes 60B which are stacked on the first electrodes 60A and are divided by the step-shaped trenches R. The number of the second electrodes 60B may be N (N is a natural number of 2 or more), and the number of the first electrodes 60A may be greater than N. While it is illustrated in the present embodiment that the number of the second electrodes 60B, that is, N, is 3, it is to be noted that the present embodiment is not limited thereto. While not shown, portions of the second electrodes 60B which are divided by the step-shaped trenches R and are positioned at the same layers may be electrically coupled by wiring lines. Unlike the present embodiment, in the case where all of the electrodes 60 are divided, in order to couple the divided electrodes 60, wiring lines are needed as many as the number of the electrodes 60. In this case, as a space for arranging wiring lines is insufficient, a process margin may decrease. In the present embodiment, since the electrodes 60 are not entirely divided and only some of the electrodes 60 are divided and thus the number of necessary wiring lines is small, it is possible to minimize a decrease in process margin due to an insufficient space for arranging wiring lines.

Each of the first and second step-shaped holes H1 and H2 and the step-shaped trenches R may have a step structure. In detail, each of the first and second step-shaped holes H1 and H2 may have a pair of first step structures SW1 which face each other in the first direction FD and are symmetrical to each other and a pair of second step structures SW2 which face each other in the second direction SD and are symmetrical to each other. Each of the step-shaped trenches R may have a pair of third step structures SW3 which face each other in the first direction FD and are symmetrical to each other. The step-shaped trenches R do not have step structures in the second direction.

Each of the first step structures SW1 and the second step structures SW2 may include a plurality of steps S2 which have the same height. In an embodiment, the height of each of the steps S2 may have a size corresponding to three times the vertical pitch of the electrodes 60. While it is illustrated in the present embodiment that the height of each of the steps S2 may have a size corresponding to three times the vertical pitch of the electrodes 60, it is to be noted that the present embodiment is not limited thereto. In the case where the number of the second electrodes 60B is N, the height of each of the steps S2 may be K (K is a natural number between 2 and N+1) times the vertical pitch of the electrodes 60.

Each of the third step structures SW3 may include a plurality of steps S3 which have the same height. The height of each of the steps S3 may be the same as the vertical pitch of the electrodes 60.

By the presence of the first to third step structures SW1 to SW3, each of the electrodes 60 may have a pad region PAD which is exposed by an electrode 60 positioned on it. When viewed from the top, the pad regions PAD of the electrodes 60 may be disposed at different positions in the first direction FD and the second direction SD. While not shown, contact plugs which vertically extend may be coupled to the pad regions PAD, respectively, of the electrodes 60.

As is apparent from the above descriptions, according to the present embodiment, not the entirety but some of the electrodes 60 are divided in the slimming region SR. As a consequence, when compared to the case where all electrodes are divided, since the number of additional wiring lines needed to couple the divided electrodes is small and thus the number of entire wiring lines needed in a semiconductor memory device is reduced, the margin of a wiring line forming process may be improved. Also, when viewed from the top, because the pad regions PAD of the electrodes 60 are disposed at different positions in the first direction FD and the second direction SD, contact plugs to be coupled to the pad regions PAD may be disposed at different positions in the first direction FD and the second direction SD. Thus, when compared to the case where pad regions PAD are disposed in only the first direction FD and contact plugs to be coupled to the pad regions PAD should be disposed along only the first direction FD, it is possible to increase the gap between the contact plugs and thus it is possible to suppress the occurrence of a fail that adjacent contact plugs are short-circuited. Further, since it is not necessary to form the pad regions PAD to have a wide width in the first direction FD so as to prevent contact plugs from being short-circuited, it is possible to reduce the width of the slimming region SR in the first direction FD, whereby it is possible to provide a semiconductor memory device of a reduced size.

FIGS. 17A to 19D are simplified schematic illustrations of various views of a method for forming the semiconductor memory device described above with reference to FIGS. 12 to 16.

In detail, FIGS. 17A to 19A illustrate planar structures in respective manufacturing steps, FIGS. 17B to 19B illustrate cross-sections taken along the lines D-D' of FIGS. 17A to 19A, FIGS. 17C to 19C illustrate cross-sections taken along the lines E-E' of FIGS. 17A to 19A, and FIGS. 17D to 19D are perspective views illustrating the parts II of FIGS. 17A to 19A.

Referring to FIGS. 17A to 17D, a stack ML is formed by alternately stacking first and second material layers 70, 72 on a substrate 50 which includes a first cell region (CR1 of FIG. 12), a slimming region SR extending from the first cell region CR1 in the first direction FD and a second cell region (CR2 of FIG. 12) extending from the slimming region SR in the first direction FD.

The slimming region SR may be divided into a plurality of slimming regions, e.g., first and second slimming regions SR1 and SR2, which are disposed in a line along the first direction FD. While it is illustrated in the present embodiment, as an example, that the slimming region SR includes two slimming regions, that is, first and second slimming regions SR1 and SR2, it is to be noted that the embodiment is not limited thereto.

The first material layers 70 and the second material layers 72 may be formed of different materials. For example, the first material layers 70 may be formed of a first dielectric material for obtaining layers which are used as sacrificial layers. The second material layers 72 may be formed of a second dielectric material for obtaining interlayer dielectric layers. The first dielectric material may have an etching selectivity with respect to the second dielectric material making the second material layers 72. For example, the first material layers 70 may be formed of silicon nitride, and the second material layers 72 may be formed of silicon oxide.

Next, by etching the stack ML, a plurality of step-shaped trenches R are formed in the slimming region SR. The step-shaped trenches R may have shapes which are respectively disposed in the first and second regions SR1 and SR2 and extend along the second direction SD when viewed from the top. The step-shaped trenches R may be formed through processes to be described below.

First, a line type mask pattern PR0 including line type openings which respectively expose the first and second regions SR1 and SR2 along the second direction SD is formed on the stack ML. Then, the step-shaped trenches R are formed by alternately and repeatedly performing a plurality of etching processes and a plurality of trimming processes. In each of the etching processes, the stack ML may be etched by a first etching depth by using the mask pattern PR0 as an etch barrier. The first etching depth may be the same as the vertical pitch of the first material layers 70. In each of the trimming processes, the widths of the openings of the mask pattern PR0 in the first direction FD and the second direction SD may be increased. More specifically, according to an embodiment, the stack ML may be etched by a first etching depth by a first etching process using a mask pattern PR0 as an etch barrier. After the first etching process, a first trimming process may be performed for increasing the widths of the first openings. Then, the stack ML may be etched by the first etching depth by a second etching process using the trimmed mask pattern PR0 as an etch barrier. After the second etching process second trimming process may be performed. In this way, the etching process and the trim process are repeated alternately.

Each of the step-shaped trenches R may have a pair of third step structures SW3 which face each other in the first direction FD and are symmetrical to each other. The third step structures SW3 may have the same number of steps. While it is illustrated in the present embodiment that the number of steps in each of the third step structures SW3 is 3, it is to be noted that the present embodiment is not limited thereto and that any desired number of steps may be formed by repeating the etching and trimming steps in an alternate manner.

The line type mask pattern PR0 may be formed using a photolithography process. The line type mask pattern PR0 may be removed after forming of the step-shaped trenches R.

Referring to FIGS. 18A to 18D, by etching portions of the stack ML which is formed with the step-shaped trenches R, a plurality of first step-shaped holes H1 are formed. The first step-shaped holes H1 may be formed through processes to be described below.

First, a first hole type mask pattern PR1 including first opening holes which respectively open portions of the step-shaped trenches R is formed on the stack ML which is formed with the step-shaped trenches R. The first opening holes may have shapes which traverse the step-shaped trenches R in the first direction FD, and the width of each of the first opening holes measured in the first direction FD may be larger than the width of each of the step-shaped trenches R measured in the first direction FD.

Then, the first step-shaped holes H1 are formed by alternately repeating a pad etching process of etching the stack ML at a second etching depth and thereby recessing the step-shaped trenches R through using the first hole type mask pattern PR1 as an etch barrier and a trimming process of increasing the widths of the first opening holes in the first direction FD and the second direction SD.

In the case where the number of unit etching processes for forming the step-shaped trenches R is N (N is a natural number), the second etching depth may be K (K is a natural number between 2 and N+1) times the vertical pitch of the first material layers 70.

Each of the first step-shaped holes H1 may have first step structures SW1 which face each other in the first direction FD and are symmetrical to each other and second step structures SW2 which face each other in the second direction SD and are symmetrical to each other.

The first hole type mask pattern PR1 may be formed using a photolithography process, and may be removed after forming the first step-shaped holes H1.

Referring to FIGS. 19A to 19D, a second step-shaped hole H2 is formed by recessing the first step-shaped hole H1 and the step-shaped trench R which are formed in the second region SR2. The second step-shaped hole H2 may be formed through processes to be described below.

First, a second hole type mask pattern PR2 including a second opening hole which opens the first step-shaped hole H1 of the second region SR2 is formed on the stack ML. Then, the second step-shaped hole H2 is formed by etching the stack ML using the second hole type mask pattern PR2 as an etch barrier such that the first step-shaped hole H1 and the step-shaped trench R are recessed.

The second hole type mask pattern PR2 may be formed using a photolithography process, and may be removed after forming the second step-shaped hole H2.

Thereafter, while not shown, the stack ML is divided by forming a slit (ST of FIGS. 12 and 15) which vertically passes through the stack ML and traverses the first and second step-shaped holes H1 and H2 in the first direction FD.

Then, channel structures (CH of FIG. 12) which vertically pass through the stack ML are formed in the first and second cell regions CR1 and CR2, and the first material layers 70 which are used as sacrificial layers are removed. After that, by filling an electrode material in spaces which are formed by removing the first material layers 70, electrodes (60 of FIGS. 13 to 15) are formed.

As is apparent from the above descriptions, according to the present embodiment, it is possible to prevent the electrodes 60 of the first and second electrode structures MB1 and MB2 from being divided, even without using an additional mask in the pad etching process.

Figure 20:
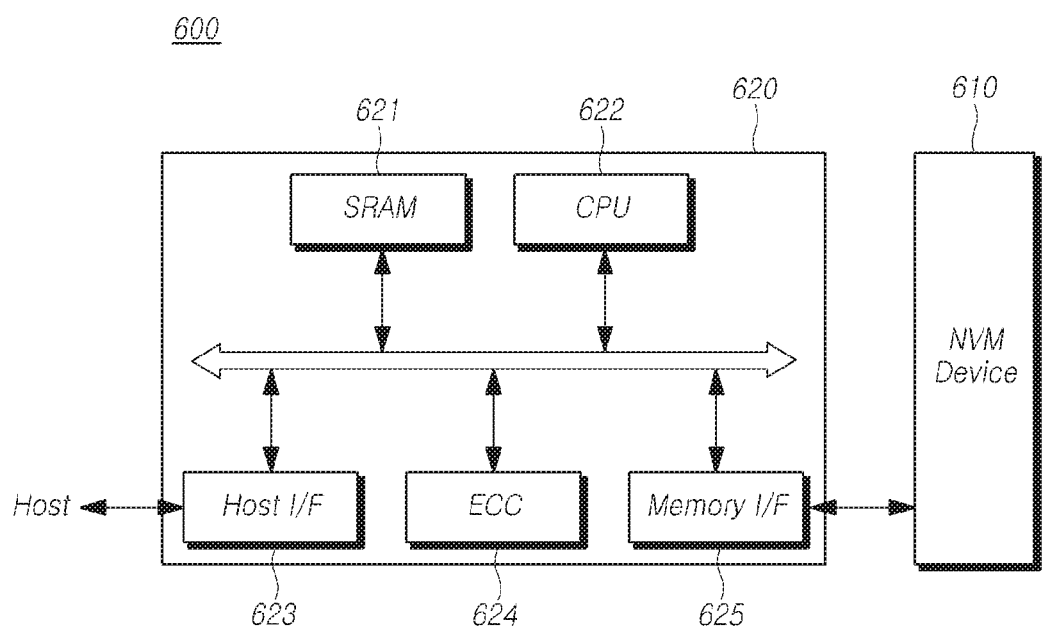
FIG. 20 is a block diagram schematically illustrating an exemplary configuration of a memory system including a semiconductor memory device in accordance with an embodiment of the present disclosure.

FIG. 20 is a simplified block diagram schematically illustrating a memory system including a memory device according to an embodiment of the present invention.

Referring to FIG. 20, the memory system 600 may include the semiconductor memory device 610 and a memory controller 620.

The semiconductor memory device 610 may comprise a memory device according to an embodiment of the invention as described above, and may be operated in a manner as described above. The memory controller 620 may control the semiconductor memory device 610. For example, the combination of the semiconductor memory device 610 and the memory controller 620, may be configured as a memory card or a solid-state disk (SSD). The memory controller 620 may include an SRAM 621, a central processing unit (CPU) 622, a host interface 623, an ECC block 624, a memory interface 625.

The SRAM 621 may be used as the working memory of the CPU 622. The host interface 623 may include the data exchange protocol of a host which may be coupled with the memory system 600.

The ECC block 624 may detect and correct an error included in the data read out from the semiconductor memory device 610.

The memory interface 625 may interface with the semiconductor memory device 610. The CPU 622 may perform general control operations for data exchange of the memory controller 620.

Although not shown, it should become apparent to a person skilled in the art that the memory system 600 may further be provided with a ROM which stores code data for interfacing with the host. The semiconductor memory device 610 may be provided as a multi-chip package constructed by a plurality of flash memory chips.

The memory system 600 may be used as a storage medium of high reliability having a low probability of an error occurring. The aforementioned nonvolatile memory device may be provided for a memory system such as a solid-state disk (SSD). The memory controller 620 may communicate with an external device (for example, the host) through one of various interface protocols such as a USB (universal serial bus) protocol, an MMC (multimedia card) protocol, a PCI-E (peripheral component interconnection express) protocol, an SATA (serial advanced technology attachment) protocol, a PATA (parallel advanced technology attachment) protocol, an SCSI (small computer system interface) protocol, an ESDI (enhanced small disk interface) protocol and an IDE (integrated device electronics) protocol and the like.

Figure 21:
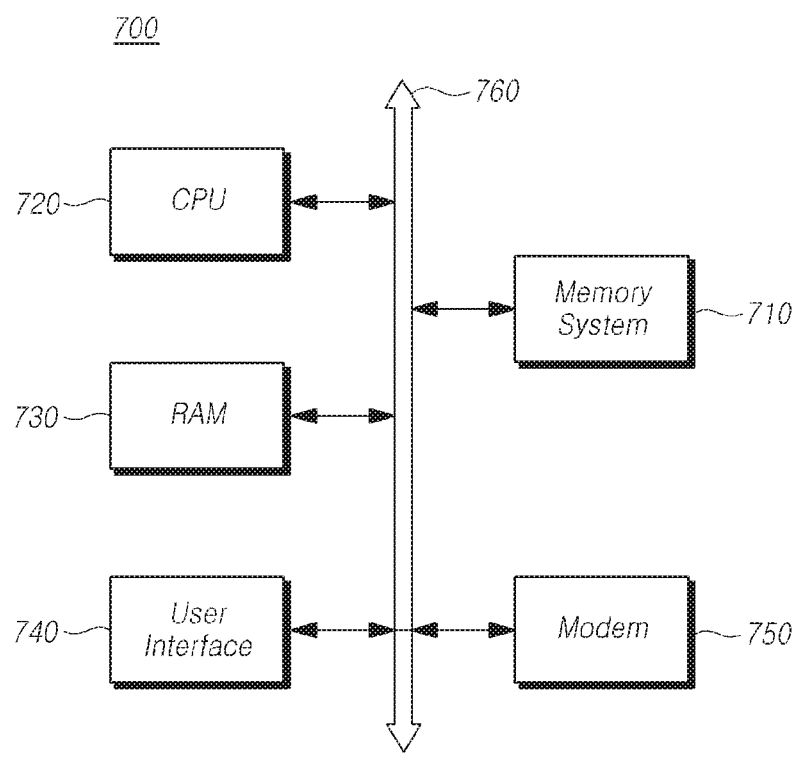
FIG. 21 is a block diagram schematically illustrating an exemplary configuration of a computing system including a semiconductor memory device in accordance with an embodiment of the present disclosure.

FIG. 21 is a simplified block diagram schematically illustrating a computing system including a memory device, according to an embodiment of the present invention.

Referring to FIG. 21, a computing system 700 according to an embodiment may include a memory system 710, a microprocessor (or CPU) 720, a RAM 730, a user interface 740, and a modem 750 such as a baseband chipset, which are electrically coupled to a system bus 760. In an embodiment, the computing system 700 may be a mobile device, in which case a battery (not shown) for supplying the operating voltage of the computing system 700 may be additionally provided. Although not shown in the drawing, it should become apparent to a person skilled in the art that the computing system 700 may further comprise an application chipset, a COMS image sensor (CIS), a mobile DRAM, and so on. The memory system 710 may be configured, for example, as an SSD (solid state drive/disk) which uses a nonvolatile memory to store data. Also, as an example, the memory system 710 may be provided as a fusion flash memory (for example, a NAND or a NOR flash memory).

It is noted that the above-described embodiments are not realized only by a device and a method, but they may be realized also by a program which performs a function corresponding to the configuration of each embodiment or a recording medium on which the program is recorded. Such realization may be easily derived from the descriptions of the above-described embodiments by a person skilled in the art to which the embodiments pertain.

Although various embodiments have been described for illustrative purposes, it will be apparent to those skilled in the art that various changes and modifications may be made without departing from the spirit and scope of the invention as defined in the following claims.

What is claimed is:

1. A semiconductor memory device comprising:
    a substrate defined with a first cell region, a slimming region extending from the first cell region in a first direction and a second cell region extending from the slimming region in the first direction;
    first and second electrode structures each including a plurality of electrodes which are stacked on the substrate, and disposed to be separated from each other in a second direction crossing with the first direction, with a slit interposed therebetween; and
    a plurality of step-shaped holes disposed in the slimming region along the first direction, and respectively formed in the first and second electrode structures, wherein each of the step-shaped holes includes first step structures which face each other in the first direction, are symmetrical to each other and are separated by the slit and second step structures which face each other in the second direction and are symmetrical to each other.

2. The semiconductor memory device according to claim 1, wherein each of the step-shaped holes has a width measured in the second direction that is less than the total width of the first electrode structure, the second electrode structure and the slit measured in the second direction.

3. The semiconductor memory device according to claim 1, wherein each of the first step structures and the second step structures includes a plurality of steps which have the same height.

4. The semiconductor memory device according to claim 3, wherein a height of each of the steps is the same as a vertical pitch of the electrodes.

5. The semiconductor memory device according to claim 3, wherein the first step structures and the second step structures include the same number of steps.

6. The semiconductor memory device according to claim 1, further comprising:
step-shaped trenches vertically penetrating portions of the electrodes in the slimming region and each including third step structures which face each other in the first direction and are symmetrical to each other,
wherein, when viewed from the top, the step-shaped trenches intersect with the first and second step-shaped holes and traverse the first and second electrode structures in the second direction.

7. The semiconductor memory device according to claim 6, wherein the electrodes comprise:
a plurality of first electrodes not divided by the step-shaped trenches; and
N (N is a natural number of 2 or more) number of second electrodes stacked on the first electrodes and divided by the step-shaped trenches.

8. The semiconductor memory device according to claim 7, wherein the number of the first electrodes is greater than N.

9. The semiconductor memory device according to claim 7, wherein the first step structures and the second step structures include a plurality of steps which have the same height.

10. The semiconductor memory device according to claim 9, wherein a height of each of the steps has a size corresponding to K times the vertical pitch of the electrodes, and K is a natural number between 2 and N+1.

11. The semiconductor memory device according to claim 7, wherein each of the third step structures includes a plurality of steps which have the same height.

12. The semiconductor memory device according to claim 11, wherein a height of each of the steps is the same as the vertical pitch of the electrodes.

13. A method for forming a semiconductor memory device, comprising:
forming a stack by alternately stacking first and second material layers on a substrate including a first cell region, a slimming region extending from the first cell region in a first direction and a second cell region extending from the slimming region in the first direction;
forming a hole type mask pattern having first opening holes which are disposed in a line along the first direction, on the stack;
forming first step-shaped holes each including a pair of first step structures which face each other in the first direction and are symmetrical to each other and a pair of second step structures which face each other in a second direction crossing with the first direction and are symmetrical to each other, by etching the stack through a pad etching process using the hole type mask pattern as an etch barrier;
forming a second step-shaped hole by etching the stack such that at least one of the first step-shaped holes is recessed; and
dividing the stack by forming a slit which traverses the first and second step-shaped holes in the first direction, in the stack.

14. The method according to claim 13, further comprising:
performing a trimming process of increasing widths of the first opening holes in the first direction and the second direction, after performing the pad etching process,
wherein the pad etching process and the trimming process are alternately and repeatedly performed.

15. The method according to claim 14, wherein the pad etching process etches the first and second material layers at a depth corresponding to a vertical pitch of the first material layers.

16. The method according to claim 13, further comprising, after the forming of the stack and before the forming of the hole type mask pattern:
forming a line type mask pattern having line type openings which respectively traverse portions to be formed with the first and second step-shaped holes, on the stack; and
forming step-shaped trenches each including a pair of third step structures which face each other in the first direction and are symmetrical to each other, by etching the stack through a unit etching process using the line type mask pattern as an etch barrier.

17. The method according to claim 16, further comprising:
performing a trimming process of increasing an opening area of the line type mask pattern, after performing the unit etching process,
wherein the unit etching process and the trimming process are alternately and repeatedly performed.

18. The method according to claim 17, wherein the unit etching process etches the first and second material layers at a depth corresponding to the vertical pitch of the first material layers.

19. The method according to claim 18, wherein, in the case where the number of unit etching processes is N (N is a natural number), an etching depth of the pad etching process is K (K is a natural number between 2 and N+1) times the vertical pitch of the first material layers.

20. A semiconductor memory device, comprising a substrate;
a stack of alternating first and second material layers on the substrate including a first cell region, a slimming region extending from the first cell region in a first direction and a second cell region extending from the slimming region in the first direction;
first and second step-shaped holes penetrating the stack at least partially in a third direction, each of the first and second step-shaped holes including a pair of first step structures which face each other in the first direction and are symmetrical to each other and a pair of second step structures which face each other in a second direction crossing with the first direction and are symmetrical to each other;

a slit which divides the stack and traverses the first and second step-shaped holes in the first direction, and first and second step-shaped trenches each traversing the entire stack in the second direction and intersecting with the first and second step-shaped holes, respectively.

\* \* \* \* \*